(12) United States Patent
Goel et al.

(10) Patent No.: US 10,846,640 B2
(45) Date of Patent: Nov. 24, 2020

(54) ARCHITECTURE, ENGINEERING AND CONSTRUCTION (AEC) RISK ANALYSIS SYSTEM AND METHOD

(71) Applicant: Autodesk, Inc., San Rafael, CA (US)

(72) Inventors: Shubham Goel, San Francisco, CA (US); Charis Kaskiris, Berkeley, CA (US); Patricia Keaney, Greenbrae, CA (US); Anand Rajagopal, Berkeley, CA (US); Manu Venugopal, San Francisco, CA (US)

(73) Assignee: AUTODESK, INC., San Rafael, CA (US)

( * ) Notice: Subject to any disclaimer, the term of this patent is extended or adjusted under 35 U.S.C. 154(b) by 159 days.

(21) Appl. No.: 15/996,230

(22) Filed: Jun. 1, 2018

(65) Prior Publication Data

US 2018/0349817 A1 Dec. 6, 2018

Related U.S. Application Data

(60) Provisional application No. 62/513,923, filed on Jun. 1, 2017.

(51) Int. Cl.
| | |
|---|---|
| *G06Q 10/06* | (2012.01) |
| *G06Q 50/08* | (2012.01) |
| *G06K 9/62* | (2006.01) |
| *G06N 3/08* | (2006.01) |
| *G06N 5/04* | (2006.01) |
| *G06N 20/00* | (2019.01) |
| *G06F 30/13* | (2020.01) |

(52) U.S. Cl.
CPC ......... *G06Q 10/0635* (2013.01); *G06F 30/13* (2020.01); *G06K 9/623* (2013.01); *G06N 3/08* (2013.01); *G06N 5/046* (2013.01); *G06N 20/00* (2019.01); *G06Q 10/0633* (2013.01); *G06Q 10/06395* (2013.01); *G06Q 50/08* (2013.01)

(58) Field of Classification Search
CPC .......... G06Q 10/0635; G06Q 10/0633; G06Q 10/06395; G06Q 50/08; G06N 20/00; G06N 3/08; G06N 5/046; G06F 30/13; G06F 30/12; G06K 9/623
USPC ...................................... 705/7.28
See application file for complete search history.

(56) References Cited

U.S. PATENT DOCUMENTS

| | | | | |
|---|---|---|---|---|
| 8,606,624 B2 * | 12/2013 | Harsh | ............... | G06Q 10/06395 705/7.41 |
| 2009/0089108 A1 * | 4/2009 | Angell | ................... | G06Q 10/00 705/7.28 |
| 2016/0148133 A1 * | 5/2016 | Haggar | ............... | G06Q 10/0635 705/7.14 |
| 2016/0314416 A1 * | 10/2016 | Guven | ............... | G06Q 10/0635 |
| 2017/0357923 A1 * | 12/2017 | Gattie | ................ | G06Q 10/0639 |

(Continued)

*Primary Examiner* — Dylan C White
(74) *Attorney, Agent, or Firm* — Gates & Cooper LLP

(57) ABSTRACT

A system and method provide the ability to control an architecture, engineering, and construction (AEC) project workflow. AEC data regarding a quality of construction is obtained. A set of classifiers and machine learning models are obtained. The AEC data is augmented based on the set of classifiers and machine learning models. A risk metric is generated for one or more issues in the AEC data based on the augmented AEC data. The risk metric is interactively generated and presented on a display device. Work, project resourcing, and/or training are prioritized based on the risk metric.

24 Claims, 17 Drawing Sheets

(56) References Cited

U.S. PATENT DOCUMENTS

2018/0268313 A1* 9/2018 Baxter ............... G06Q 10/0635
2019/0180140 A1* 6/2019 Sasson ................. G06K 9/6256

* cited by examiner

HIGH RISK ISSUES

Issue #000681  ⟨ ⟩ ✕

OPEN

The concrete slab...

Assigned to: *CC Concrete*

Created by: *jon.doe@autodesk.com on 2016-11-02*

The concrete slab is not aesthetically looking good, there is an RFI that was closed. It was recommended, once attained rinse surface well with clear water, allow to dry, and paint an epoxy. This will require grinding of the surface and preparation. Will delay the schedule.

RISK ASSESSMENT ⓘ *About Risk*

Risk Level:

[ High ▾ ] ─602

Categories

[ 🔲 *Key Activity*  ✕ ▲ ] ─604

💧 Water- Risk of a water event (building enclosure, site damage, system, weather) that will result in damage to existing construction or clean up effort ↻ Rework- Risk of causing major rework above a set cost (for example, $2,500) to any party - owner, designer, contractor or trade contractors 📋 Inspection- Risk of a failed inspection or test that the project team had expected to pass 💧 Water is leaking in though the gap in the curtain wall, there might a fault with the fla...

*FIG. 6*

SUBCONTRACTOR RISK

| Today | Overall |
|---|---|
| CC Concrete | High |
| Sunshine Weatherproofing | Med |
| Joe's Plumbing | Med |
| Stark MEP | Med |
| Drywall Inc. | Med |
| Closet Closets | Med |
| Steelers | Med |
| Xavier Rainscreens | Med |
| United Construction | Med |
| Click Electricals | Low |
| Martha's Landscaping | Low |
| Rebar Co. | Low |
| Rebar Masters | Low |
| Silver Oaks Appliances | Low |
| Star Elevators | Low |
| Tan Carpets | Low |
| Varsity Builders | Low |
| zzzCarolina Fire | Low |

*FIG. 7*

SUBCONTRACTOR RISK

| Today | Overall |
|---|---|
| CC Concrete | 7 |
| Drywall Inc. | 3 |
| Stark MEP | 7 |
| Steelers | 5 |
| United Construction | 5 |
| Closet Closets | 4 |
| Joe's Plumbing | 5 |
| Sunshine Weatherproofing | 4 |
| Xavier Rainscreens | 4 |
| Click Electricals | 0 |
| Martha's Landscaping | 0 |
| Rebar Co. | 0 |
| Rebar Masters | 0 |
| Silver Oaks Appliances | 0 |
| Star Elevators | 0 |
| Tan Carpets | 0 |
| Varsity Builders | 0 |
| zzzCarolina Fire | 0 |

*FIG. 8*

PROJECT RISK OVERVIEW

14 Active projects

- 4 High Risk Today
- 3 Medium
- 5 Low
- 2 Unknown

FIG. 10

PROJECT RISK 

Today          Overall

Q Search

Need Support
| Bayfront Arena | High |
| Dos Flores Resort | High |
| Lumina Casino and Hotel | High |
| Market Medical Center | High |
| Hotel G San Francisco | Med |
| Pleasant Court Building | Med |
| Castle Medical Center | Med |

Leader Board
| Alameda High School | Low |
| Farshield Multiuse Complex | Low |
| Golden Gate Performing Arts... | Low |
| Hollywood Theater | Low |
| Hotel Gillion | Low |

FIG. 11

ARCHITECTURE, ENGINEERING AND CONSTRUCTION (AEC) RISK ANALYSIS SYSTEM AND METHOD

CROSS-REFERENCE TO RELATED APPLICATIONS

This application claims the benefit under 35 U.S.C. Section 119(e) of the following commonly-assigned U.S. provisional patent application(s), which is/are incorporated by reference herein:

Provisional Application Ser. No. 62/513,923, filed on Jun. 1, 2017, with inventor(s) Shubham Goel, Charis Kaskiris, Patricia Keaney, Anand Rajagopal, and Manu Venugopal, entitled "ARCHITECTURE, ENGINEERING, AND CONSTRUCTION (AEC) RISK ANALYSIS SYSTEM AND METHOD".

BACKGROUND OF THE INVENTION

1. Field of the Invention

The present invention relates generally to architectural, engineering, and construction (AEC) systems, and in particular, to a method, apparatus, system, and article of manufacture for generating and analyzing risk metrics in the AEC industry.

2. Description of the Related Art

In the chaotic, constantly changing environment on a construction site, hundreds or thousands of project issues arise on a daily, weekly, and monthly basis. Team leaders such as superintendents and project managers must sift thought, analyze, and determine the most critical items requiring attention on varying time basis. Based on such determinations, the team leaders must manage subcontractors and projects accordingly. Further, actions taken on one day will change the risk prioritization in subsequent days/weeks/months. Accordingly, what is needed is the ability to manage risk and improve performance on both a short-term and long-term basis. Such needs include the ability to quickly, efficiently, and dynamically analyze short-term and long-term risks while providing recommendations/visual indicators for team leaders to appropriately manage projects and subordinates to complete and advance an AEC project in an expeditious manner, thereby improving project performance.

SUMMARY OF THE INVENTION

In construction, mobile devices, drones, cameras, wearables, and sensors capture data in the field which are aggregated in the cloud. In many construction projects, it is typical to have thousands of open issues (e.g., problems in one or more transactions, requests for information, change orders, etc.). Supervisors often have to spend an entire day going through a long list without any concept (except for the supervisors human knowledge) of which issues are critical or may become critical and have a major impact on a construction project in the future.

Embodiments of the invention combine machine learning models with other contributing factors to identify which projects are at risk and which subcontractors are at risk on any given day. Such risks may be prioritized based on risk level and category. Further, users (e.g., supervisors) can edit the risk levels/categories thereby modifying the machine learning model to provide increasingly accurate information the more a system and method of the invention are utilized.

Further embodiments of the invention enable the ability to view risk across all projects and subcontractors (e.g., via a heat map or other interactive visualization interface).

BRIEF DESCRIPTION OF THE DRAWINGS

Referring now to the drawings in which like reference numbers represent corresponding parts throughout:

FIG. 6 illustrates an interface for user feedback on classification output in accordance with one or more embodiments of the invention;

FIG. 7 illustrates subcontractor risks today in accordance with one or more embodiments of the invention;

FIG. 8 illustrates subcontractor risks overall in accordance with one or more embodiments of the invention;

FIG. 10 illustrates an exemplary output consisting of an overview of all projects for an account in accordance with one or more embodiments of the invention;

FIG. 11 illustrates an exemplary output consisting of projects sorted by project risk level in accordance with one or more embodiments of the invention;

DETAILED DESCRIPTION OF THE PREFERRED EMBODIMENTS

Figure 1:
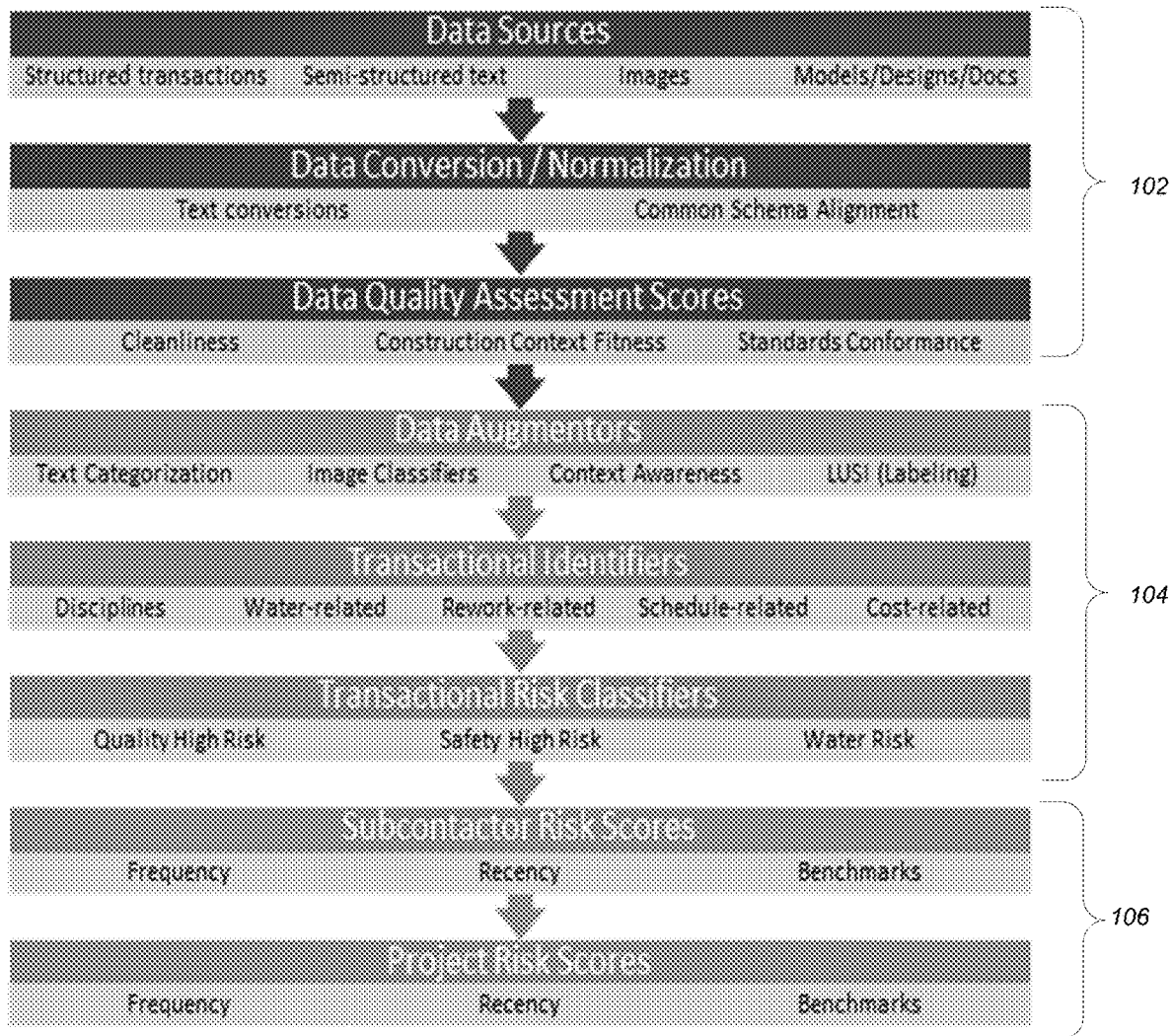
FIG. 1 illustrates the data risk architecture of one or more embodiments of the invention.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Embodiments of the invention implement an AEC Risk Analysis System and Method that provides a fully-integrated risk management system for AEC construction quality. Fully-integrated in the manner that it provides infrastructure and technical capabilities for the ingestion and manipulation of data (of different data sources and data types); provides functionality for on-the-fly/batch classification of data captured; data quality assessments and subsequent normalizations to common schemas; prediction of risk level scores for different levels of aggregation (e.g. (sub)contractor, project, general-contractor); a system to visualize the risk scores and intermediary steps in a evidence-based manner. The system also provides a way for active learning by allowing users of the system to validate predictions and provide feedback loops.

Audience and Purpose

The AEC Risk Analysis System is a data-driven model-powered implementation in software of risk metrics for the AEC industry. In broad terms, data regarding quality of construction (e.g. from apps, images, text, drawings) are ingested, manipulated, and converted by a cascading set of classifiers and machine-learning models into risk metrics (subcontractor and project level). Those are presented to users through applications denoting the risks, their components, and the evidence that was relied on. Users make use of these metrics for prioritization of work, for prioritization of project resourcing and/or training. These scores, or derivative indexed metrics, may further be expanded and used for procurement purposes and power downstream decisions.

There is a set of personas that this system and method is designed for that involves anyone who deals the data quality, AEC project quality managers, project managers and beyond.

Data Risk Architecture

The risk analysis system of embodiments of the invention analyze and manipulate data and this demands a level of data orchestration that deals specifically with AEC data workflows and payloads. The conceptual orchestration is instantiated in this system, and the data and model architecture of the system and method are presented in FIG. 1.

There are three major layers that characterize the way data flows and is modified along the way. The system and method architecture focuses on three main layers of interaction with data:

1. Data Layer 102: assess the data and configure for downstream use
2. Data Augmentation Layer 104: augment the data and prepare for scoring
3. Model Scoring Layer(s) 106: Risk scores based on use cases utilizing data from the data layer(s).

The data layer 102 includes data sources (structured transactions, semi-structured text, images, and models/designs/docs), data conversation/normalization (text conversions and common schema alignment), and data quality assessment scores (cleanliness, construction context fitness, and standards conformance). Specifically, these data quality aspects can be described as follows:

1. Text Conversions;
2. Common Schema Alignment: data ingested from different systems come in different structured formats. Embodiments of the invention allow for the normalization of meta data about these different data sources by applying classifiers across the text-based sources.
3. Cleanliness: data cleanliness refers to a variety of inconsistencies across data that are fixed through the use of filter converters:
   a. Improper capitalization;
   b. Abbreviation conversions; and
   c. Unit conversions;
4. Construction Context Fitness: embodiments of the invention utilize a set of topic modeling engines that can determine how close the language used in the particular text is close to construction language topics (e.g. a set word2vec topic models based on RFIs, Change Orders, Quality Issues, Safety Issues, Building Standards, Submittals, Contracts);
5. Standards Conformance: a secondary aspect of the topic models is to identify if the particular text provided (e.g. RFI text conforms to CAD standards, building code standards)

The data augmentation layer 104 includes data augmentors (text categorization, image classifiers, context awareness, and LUSI [labeling]), transactional identifiers (disciplines, water-related, rework-related, schedule-related, and cost-related), and transactional risk classifiers (quality high risk, safety high risk, and water risk).

The model scoring layer 106 include subcontractor risk scores (frequency, recency, and benchmarks) and project risk scores (frequency, recency, and benchmarks).

Machine Learning Components

There is a set of machine-learning driven, model-based components that are developed and updated through the use of the data augmented by the data flow process illustrated in FIG. 1. Its main machine-learning driven components include:

1. Data Quality Scores: assessing the quality of data ingested and making assessments on which data can be used for modeling, updating, score development.
2. LUSI (a method for dealing with shortage of labels): as part of the model building effort that is used to accommodate the low numbers of labels.
3. Issue Severity Risk classifiers: based on the individual transactions that provide categorizations.
4. Image/Text Recognition classifiers: used for augmentation and powering better data quality capture workflows.
5. SubContractor Scores (daily and cumulative): these are scoring systems utilizing specific formulations, weights, and transition functions (benchmarks) that generate risk assessments.
6. Project Scores (daily and cumulative): similar to subcontractor scores these scores reflect higher aggregation levels but also specific metrics relating to projects as well as project level benchmarks.

Figure 2:
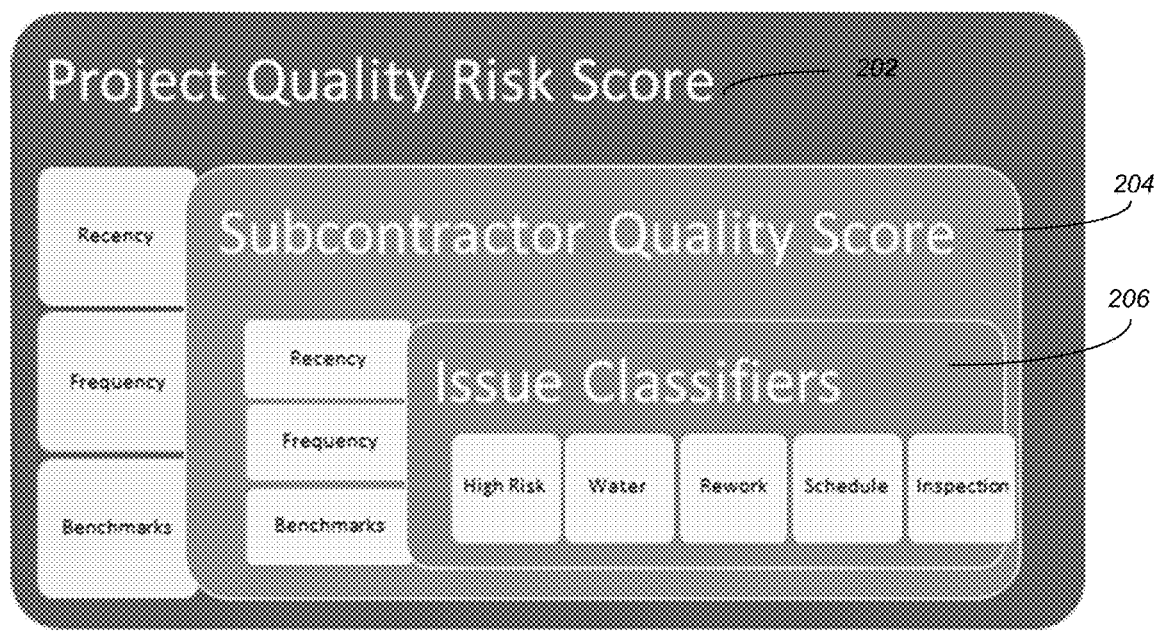
FIG. 2 illustrates a Risk Model Nesting Architecture in accordance with one or more embodiments of the invention.

These different models live in a nested modeling architecture where each broader model category utilizes the outputs of narrower-scope model predictions. FIG. 2 illustrates how these models are nested in each other in accordance with one or more embodiments of the invention. As illustrated, the project risk score 202 is the broader model category that includes the recency, frequency, and benchmarks. Nested in the project score is the subcontractor quality score 204 that also includes the recency, frequency, and benchmarks. Nested within subcontractor quality score 204 are the issue classifiers 206 that include high risk, water, rework, schedule, and inspection.

The following sections provide deeper details about the different levels of models utilized at each layer of the architecture. The overall category of Quality is initially described including an explanation of data quality scores followed by data augmentors utilizing text-mining elements to classify construction text. Some of these models also feed the data quality scores. The next sections go through the actual implementations of the risk models (scores). A description provides how the architecture may be augmented by the use of intelligent-data capture technology making use of image processing and text-models to assist in the capture and organization of data of higher levels of quality. Lastly, a description of LUSI (Labelling Using Scale Input, aka labelling large datasets using human scale input) is provided.

Data Quality Scores

Assessments of data quality are critical in understanding: (1) the data capture process; (2) whether the data capture tools are utilized as expected; (3) whether the data can be used for modeling downstream; and (4) whether there is data shift involved that will trigger downstream processes.

This assessment can be operationalized along different levels of assessment and utilized further for data calibration, data trust, and related human assessments of efficacy and efficiency. Some of the main aspects of analysis reflected in the data scores are:

1. Assess if the particular projects utilize applications in a consistent manner utilizing benchmarks both at the specific metric level (e.g. detection of extreme values) as well as deviation from behavioral patterns (e.g. KL [Kullback-Leibler] divergence between distribution of activity versus benchmarked normative behaviors)
2. Assess if the cleanliness, consistency, topic-orientation of construction related text. This is achieved through metrics of consistency of construction language, which topics are covered, the complexity of what is described. (e.g. descriptions are too short; contain many questions; describe complex contexts)
3. Assess the level of expertise of the author of particular textual sources. (e.g. models that classify if they were generated by engineers, versus trades of build systems)

This particular set of scores provides a way to understand the following questions:

1. Is the set of the data capture tools utilized at the level of engagement expected?
2. Is the quality of the data collected conform to data governance requirements?
3. Is the material collected cover contextual completeness?
4. Is the data collected appropriate to be fed into classifiers, risk models?

The different data sources that are utilized for assessment fall, but are not restricted to, the following construction data types:

1. BIM models
2. Contracts
3. Construction Quality data (as part of a Quality Program, Ad-Hoc)
4. Construction Safety data (as part of a Safety Program)
5. Construction Project Management data
   a. Request for Information (RFI)
   b. Request for Change Order (RCO) and related Change Management workflow text artifacts
   c. Submittals (Submittals)
6. Construction Images
   a. Captured by phones, tablets, cameras
   b. Captured by drones
7. Construction Text (not limited to)
   a. Building Code
   b. Contracts
   c. Design specifications
   d. Request for Information (RFI)
   e. Change Orders (CO)
   f. Submittals Data Quality Scores and Classifiers Data quality scores are based on analytic models that assess the data flow, the data elements, and comparisons with benchmarked behaviors. In effect the data quality metrics deals with three types of data:

1. Text
2. Images
3. Tabular data—that is data that comes from transactional and/or dimensional stores.

Figure 3:
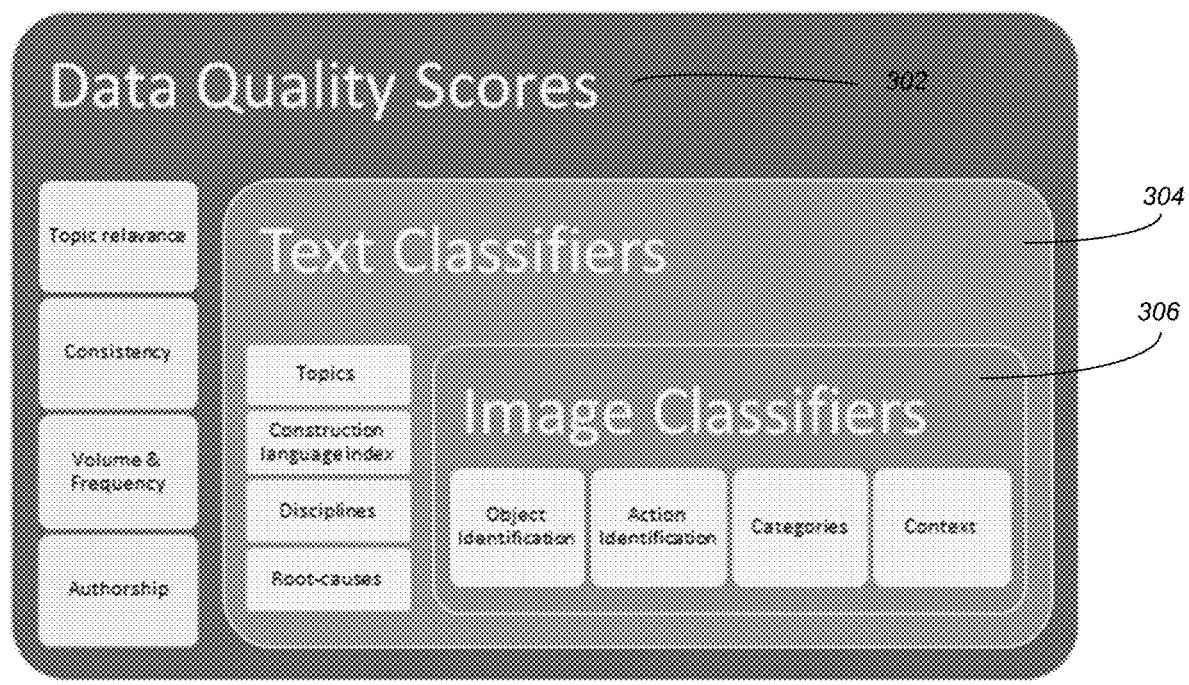
FIG. 3 illustrates the nesting of related classifiers that are used for data quality scores in accordance with one or more embodiments of the invention.

Similar to the approach used with the nested models for development of risk scores (illustrated in FIG. 2), a similar set of nesting of models may be used in data quality assessments. FIG. 3 illustrates the nesting of related classifiers that are used for data quality scores in accordance with one or more embodiments of the invention. Nested within data quality scores 302 are text classifiers 304 and image classifiers 306. The data quality scores 302 includes topic relevance, consistency, volume and frequency, and authorship. The text classifiers 304 include topics, construction language indices, disciplines, and root-causes. Image classifiers 306 include object identification, action identification, categories, and context.

Scores 302-306 are developed to ascertain the quality of the data ingested systems for the purposes of classifiers, scores. In addition, other models can be applied on the scores 302. The following provide additional analysis that may be conducted on scores 302-306:

1. Does the text data collected sufficiently good to be used by adopted issue classifiers?
2. Does the heartbeat of the transaction data ingested reflect a healthy process/project?
3. Does data coming in reflect a data shift? (i.e., does the distributions of new data ingested reflect a departure from the distributions of data the models have been trained on).

Understanding the data collected overall can resolve whether a project can be effectively served by scoring components (classifiers and scores) of embodiments of the invention. Such an understanding can also point to whether the product that tracks data is correctly utilized, how much, by whom, and whether information is correctly captured. These quality assessments can help automate pre-qualification to use the system, provide guidance to users on which data collection points need to be addressed, and in general provide a better mechanism for evaluating an AEC project.

Data quality scores can be used at different points in time for different purposes:

1. When a new client wants to utilize analysis services: does the data support the models to be run? Can the minimum viable (as described by expected performance) set of features exist to power classifiers and scores?
2. In Real-Time, these scores can provide insight on whether data quality fluctuates week by week which may denote different possible causes that can prompt actions:
   a. Who is documenting (or not)
   b. Change in process (safety, quality, etc.)
   c. Schedule dependencies (Weather, milestones)

Data Types

Embodiments of the invention evaluate different data types that are being ingested, each investigated over different properties of the data itself:
1. Structured numerical transactional data:
   a. Do the distributions within different slicers conform to what typical behavior is;
   b. are there shifts in volume of transactions that can denote inappropriate behavior (e.g. massive closing of issues over weekend cycles)
   c. KPIs (key performance indicators) (e.g. checklist conformance rates): overall, time-bound, are there conflicting patterns (e.g. all 100% after a certain point in time)
2. Slicers (e.g. project types, issue types): proportions that are either NULL or unknown. Looking at distributions of time-bound transaction volume provide a sense on whether the data collection is skewed in particular ways. (e.g. in utilizing quality issues generated by punch lists, QA/QC checklists, QA/QC non-from-checklists, or combinations of the above)
3. Text: text may be an increasingly good way to normalize classifiers across projects and across accounts. Knowledge desired includes:
   a. Is text descriptive enough to be useful?
      i. Proportion of transactions having text
      ii. Proportion of transactions having text deemed useful for classifiers (e.g. 5 keywords beyond strop-words)
   b. Does it conform to language/topics our classifiers have seen before? (e.g. run them through Topic Models like word2vec for construction; or word2vec for constructions safety)
   c. Is the text input across transactions that are not automated (e.g. issues automatically generated from checklist non-conforming items typically have the same text) variable enough?
4. Images
   a. Do the transactions have images that can be used to risk factor extraction?
   b. Has the volume of image capture changed over time?
   c. A further development is in image quality metrics that indicates the quality of the images—the overall quality of the images collected can then be assessed and provided as information to additional users. Note: embodiments of the invention may provide extensive quality measures for more types of data being ingested.

Tabular Data Scores

For any data source that comes in, there are typically sets of transactions that may be provided/maintained. These different types of transactions have a natural flow and may generate features within the following categories:
1. Time bounding: number of events within different windows of time by different types of usage
2. Time boxing: what transaction behavior is expected at particular points in time (e.g. driven by schedules, milestones, etc.)
3. EWMAs (exponentially weighted moving averages): moving averages with corresponding levels of present-bias can help identify extreme behaviors in data.
4. Skewness: is the data skewed towards a particular subcontractor, particular user, particular type of subcontractor? This can be captured by the GiniIndex (e.g., a measure of statistical dispersion from one group to another group) and provides guidance on the degree of utilization of the system—it may be a cause of concern for biasing the data collected.

The scores may be developed by a weighted linear combination of features including interaction terms and indicators that deal on whether thresholds have been reached (e.g. activation functions). These weights can be statistically determined by the weigh-of-evidence calculations.

Text Modeling

In embodiments of the invention, text received from applications may revolve around being able to detect whether the content generated is useful in both a human and artificial intelligence context. Accordingly, embodiments of the invention utilize text-mining and natural-language processing approaches to understand context and categorize text based on cause-and-effect.

Topic Models for Construction

Utilizing enhanced topic modeling techniques by utilizing subject matter expertise, and existing written documentation as well as augmented datasets from actual projects (e.g., word2vec), embodiments of the invention provide "dictionaries" of what construction language is around quality, safety, and project management. These are dimensionality reduction mechanisms that can help map different text generated for different purposes in different contexts into a unified framework. There are further "dictionaries" based on building systems, based on OSHA Safety regulations, Building Code Standards, Contracts, and other text-based construction data.

Transaction Similarity

Transaction text similarity looks at whether different types of descriptions are effectively items of the same class. The score would denote a metric of the distributions of these groups of similarity. For example, a high degree of similarity means that potentially not much variance exists which in turn makes risk scores (e.g. Sub Contractor's Scores) less effective as they cannot differentiate between subcontractors.

Image Data Scoring

Further metrics may reflect on image quality by looking at performance metrics (e.g. precision, recall, FP, FN) against classifiers. The ability of an image to be classified by different levels of certainty provide a way to assess whether the photographic data collection by the particular source is useful (what percentage of the image data can be classified by a certain level of certainty). These scores distributed and the 75 percentile computed. This provides a metric of how well the images are supporting the risk metrics generation. This metric is further weighted by the WOE (weight of evidence) and becomes part of the Data Quality Score (index).

BIM Model Data Quality Score

The purpose of this score is to assess the data health of particular BIM (building information model) models based on knowledge derived from how existing systems have used their evaluation.

Data Quality Scores (Index)

A combination of the scores developed for text quality, transaction quality, image quality can be a weighted risk metric of overall quality of data capture. These weights can either be determined from machine learning methods/algorithms (e.g. from a set of completed projects), dynamically by the user (on what they care for mostly), by a combination determined by downstream models (e.g., Classifiers, Score products). This data assessment can be generated over different time-frames to allow users to assess whether data quality is improving/consistent/deteriorating over time and/or over across projects or across the portfolio of projects Issue Risk Classification Motivation Though user research meetings with customers, it may be determined that subcontractors have to deal with thousands of constructions related issues every day on a job site. Not all these issues are born equal. Some issues carry high risk with respect to:

May cause time consuming and costly rework;

May fail a planned inspection or test;

May impact a key activity or milestone;

Water penetration or a water event; and

Other design/construction/quality risks.

Assessment of the risk level of individual construction related events (e.g. quality issues, safety issues, cost-events) can provide insight into the state of the project as well as the relative performance of different actors involved in the project. Certain types of particular categories of quality issues/RFIs (requests for information) have inherent structural risk. The system and methods developed make use of descriptions of the issues in the context of these projects to predict the following:

Predicting the risk level (High, Medium and Low); and

Predicting the risk category (Water, Rework, Inspection, High Value).

Figures 4, 5:
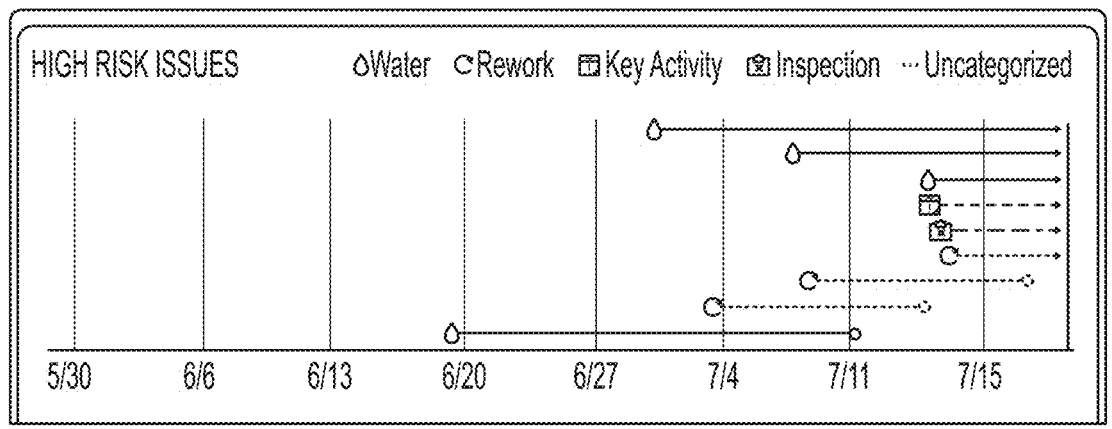
FIG. 4 is a screenshot from a graphical user interface exposed to the users that describes a high-risk issue and some of the key risk categories in accordance with one or more embodiments of the invention.
FIG. 5 shows a visualization of high risk issues and how long they are not addressed in accordance with one or more embodiments of the invention.

FIG. 4 is a screenshot from a graphical user interface exposed to the users that describes a high-risk issue and some of the key risk categories in accordance with one or more embodiments of the invention. As illustrated, the screen shot describes that the construction assistant automatically reviews all quality issues and predicts which ones create high risk for one or more key project outcomes, such as on-time delivery, margin (e.g., on budget), or customer satisfaction (e.g., high quality). Surfacing high risk issues helps ensure that something important doesn't get overlooked. Further, surfacing high risk issues helps users focus on the most important things each day and take action early before a risk turns into a liability. The interface reflects that issues may be automatically tagged into risk categories to help understand and manage key risk issues. The key risk categories may include water (e.g., water penetration or a water event), key activity (may impact a key activity or milestone), rework (may cause time consuming and costly rework), and inspection (may fail a planned inspection or test).

Text-based classification models 304 are the main components of the augmentation data layer. These models 304 implemented in the data workflow are used to predict the risk level and categories associated with an issue based on the definitions above and in that effect augment the existing data.

Similarly high risk and water issues are components that are highly predictive of project 202 and subcontractor 204 risk. Accordingly, the results of these models may be used as an input into the project 202 and subcontractor 204 risk models. This creates powerful ensembles of models, with better overall results than the sum of its parts.

Implementation

The way these models are developed is based on the augmented labelled data generated through the LUSI process (see below for detailed description). This provides a way that text-based issues/events can be classified not merely by the data content but also enhanced by the expertise of human subject matter experts. Supervised models have been developed and performance has been assessed based on internal validation, externally validated through different datasets, and/or through subject matter expert validations. In addition, embodiments of the invention may also provide a way for future users to provide guidance when there is disagreement with the classifications of these models. Regular assessments of the performance of these models is conducted based on the performance of the existing models over a sample that can provide guidance within 5% margin of error. Models are rebuilt if the performance deteriorates below a certain rate of performance.

Visualization of High Risk Issues

One of the most critical aspects of building data products and scoring systems is to provide a way for users to be able to digest the outcomes in an effective manner. This requires novel visualization schemes that convey meaning and also closing the loop with user feedback. FIG. 5 shows a visualization of high risk issues and how long they are not addressed in accordance with one or more embodiments of the invention. As illustrated, the different key risk categories (e.g., water, rework, key activity, and inspection) are displayed on a timeline that reflects when such categories may cause issues and/or problems.

User Feedback Loop

Embodiments of the invention enable customers to provide feedback on the labels the models predict. If a user disagrees with the label the model has provided, such users can go in and change that label. Any change/modification will result in re-computation of other models that use this feature as an input. FIG. 6 illustrates an interface for user feedback on classification output in accordance with one or more embodiments of the invention. As illustrated, a risk level of "high" 602 has been assigned to the concrete slab. The user is permitted to reassign the risk level and/or modify the category 604 to which the concrete slab has been assigned. Once modified by the user, other risk assessment models that use the concrete slab as an input are recomputed.

Subcontractor Risk Assessment

Overview

It is typical for a General Contractor (GC) to manage hundreds of Subcontractor specific companies on a construction project. The success of the project depends on how well the GC can manage these subcontractors working for them on a project. Given the amount of activity and daily changes on a construction site and the range of work GCs perform, managing the subcontractors is an important but difficult task. Superintendents and Project Engineers rely heavily on their experience and familiarity of the project to assess which subcontractors need their help and attention. Embodiments of the invention add value by analyzing and predicting the subcontractor risk based on project data and ranking them based on who might need the most attention that specific day.

In view of the above, one may note that construction companies barely had any system to keep track of subcontractors within a project and nothing across projects. Customer user research confirms such a problem. In order to predict subcontractor ratings, models are needed to augment the data at the issue level to qualify the data with richer tags that can be used to distinguish subcontractors. Embodiments of the invention aggregate other project-level statistics such as the closure rate and average days to close to gauge the subcontractor behavior. A combination of all these factors are used to compute scores that are rather complex but more accurate.

Further to the above, embodiments of the invention enable a workflow that involves the prediction of subcontractor ratings (daily and cumulative) and then using the prediction to prioritize work and time on a construction site. A risk heat map view of the subcontractors in a project (described below) allows executives to understand trends that shows the varying risk level across the lifetime of a project in a single glance. A cross-project version of the score can be used to help with the process of choosing subcontractors for a new contract.

Subcontractor Risk Scores

Embodiments of the invention labels subcontractors with a risk-level tag that is representative of the amount of work the subcontractor is currently accountable for and their track record on the project. Such labeling is performed by understanding the situation on the ground with the aid of a series of machine learning models. The machine learning models are built by using construction quality data recorded daily by the GC project team on the jobsite. The models assign subcontractors a risk profile based on their work on the project looking at both near and long term history. The machine learning analyzes numerous factors, not restricted to but including, the number of issues subcontractors have open, the number of days subcontractors took to close, the severity of the issues subcontractors create and the quality of subcontractor's checklist usage.

In order to understand which factors would impact the performance of subcontractors in a project, external data shared by certain customers may be analyzed. Such data contains the result of performance evaluations done on subcontractors upon completion of one or more projects. Embodiments of the invention utilize this data to derive the top contributing factors impacting the end of project subcontractor scores. To be able to evaluate these features with respect to the data that was being collected, machine learning models may be utilized to augment existing data. For example, issue severity and the classification of issues into high risk/cost categories is critical in understanding the financial impact of quality issues generated on construction sites. Embodiments of the invention utilize models that classify the risk of an issue into high, medium and low risk categories based on the way they are described. The models are based on how issues are described and validated using expert assessments. This information then further contributes into a data point that can be used to evaluate subcontractor performance.

Using these features, in combination with other factors that were determined through repeated meetings with customers to understand their current process and thoughts behind construction quality, embodiments of the invention provide a series of models that predict the risk scores of subcontractors. These factors were combined to generate a score that is used to create "high', 'medium' and 'low' category labels. To validate these results, customer perception of the results may be analyzed. For example, the model performance may be evaluated by comparing assigned tags with labels that we acquired from GC superintendents and project managers who were aware of the ground truth on their projects.

Subcontractor Performance Scores

Embodiments of the invention may generate two separate sets of ratings—a daily risk score and a risk cumulative score. The daily score is indicative of a subcontractor's risk level as of that day with respect to the amount of work they might have pending at that point. The cumulative score is more indicative of the performance of the subcontractors through the entire project and considers factors that look at a longer term. FIG. 7 illustrates subcontractor risks today and FIG. 8 illustrates subcontractor risks overall in accordance with one or more embodiments of the invention. As illustrated in FIG. 7, each task that a subcontractor is working on today (left column) has been assigned an overall risk (e.g., low, medium, or high) (right column). In FIG. 8, a numeric value (right column) is assigned to each of today's tasks.

Visualization of Subcontractor Scores on a Historical Basis

Figure 9:
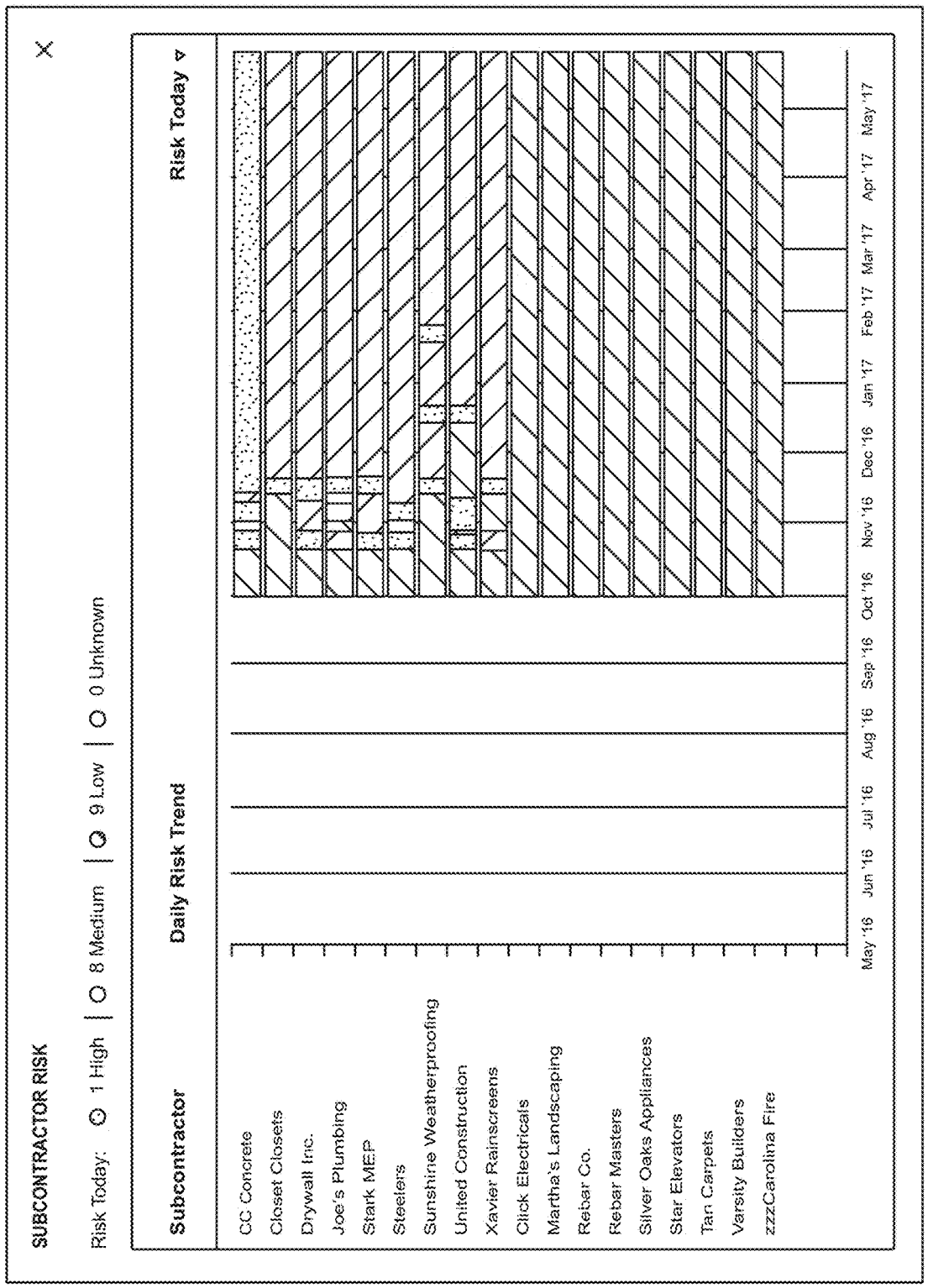
FIG. 9 illustrates a visualization of historical subcontractor quality scores in accordance with one or more embodiments of the invention.

FIG. 9 illustrates a visualization of historical subcontractor quality scores in accordance with one or more embodiments of the invention. The visualization consist of a heat-map representative of the risk level of subcontractors over time. This view allows superintendents and executives to immediately grasp how the subcontractors have been performing and the length and duration of the risk a subcontractor has been towards the project. This is again a novel way of visualizing risk within a project.

Additional embodiments include a similar score that looks at cross-project performance of subcontractors. Such a score is extremely helpful for procurement teams in construction companies when deciding on which subcontractor to hire.

Components of Subcontractor Risk Scores

There are different classes of characteristics that drive the prediction of subcontractor quality risk scores. For the Subcontractor Daily Score, the broad categories that have an impact on the score include (but are not restricted to) the following:

1. Volume, frequency and recency of issues created/closed identified by severity, risk category within short-term time horizons (e.g. 7 day, 15 day);
2. Volume, frequency and recency of issues that have not been completed/addressed as planned/expected;
   a. Delays are benchmarked against appropriate duration benchmarks based on data-driven analysis of issue types and other factors;
3. The relative performance of the subcontractors on the metrics mentioned earlier across the duration of the project; and
4. The relative performance of the subcontractors on the metrics mentioned earlier across multiple projects.

Examples of particular data attributes that are used by the machine learning models:

1. Number of High Risk Issues (HRI) created in the last week;
2. Number of HRI related to water penetration in the last week;
3. Number of issues created this week;
4. Number of issues closed this week;
5. Percentage of issues currently open;
6. Number of long overdue HRI open today;
7. Number of long overdue issues open today;
8. Ratio of the number of HRI created this week (to all subs);
9. Ratio of the number of water-related HRI created this week (to all subs);
10. Percentage of non-checklist issues created this week;
11. Checklist conformance (percentage of negative items to all items); and 12. Number of HRI created from a punch list.

Cumulative Subcontractor Score

This score provides a relative metric of the quality performance/behavior of the subcontractor over the entire duration of a project. Some important aspects taken into consideration are: what is the subcontractor behavior around issue resolution with respect to timeliness; what has been their behavior around issue hygiene, and what is the volume and severity of issues they have generated and addressed in the project.

Some of the parameters that have an impact on the Cumulative Subcontractor score are as follows:

1. Volume, frequency and recency of issues created/closed identified by severity, risk category across the duration of the project;
2. Volume, frequency and recency of issues that have not been completed/addressed as planned/expected;
   a. Delays are benchmarked against appropriate duration benchmarks based on data-driven analysis of issue types and other factors;
3. Exhibition of positive behaviors including, but not restricted to, proactive communication, good BIM 360 field usage and good issue hygiene; and
4. The relative performance of the subcontractors on the metrics mentioned earlier across the duration of the project.

In addition to looking at quality issue data, other data sources may also be added into the mix. Apart from the sources mentioned in the list below, weather data, insurance claims, warranty, and RFIs could be used to make more accurate predictions (e.g. improve performance of risk models). For example, construction data sources may include design models and drawings, images, construction documents, point clouds, schedules, voice recordings, issues and checklists, and sensors/IOT.

Project Risk Assessment

Overview

It is typical for large General Contractors (GC) to have several hundred projects active at any given point of time. It is a challenge for executives to be able to monitor these many projects remotely and evaluate which projects are on schedule versus those that might require more attention. Embodiments of the invention add value by analyzing and predicting the project risk based on project data and ranking them based on which projects might need the most attention. The interface also provides for a convenient view to see all the projects on a map overlaid with the risk profile for each project.

Accordingly, embodiments of the invention provide a simple interface that shows all the projects with a risk-level tag that is representative of the project quality risk and allows users to filter by common filters such as business unit and project types. Four important dimensions to project risk are the quality, safety, schedule and cost. The data with respect to subcontractor performance is derived from a series of machine learning models that predict the risk level of a subcontractor.

Process

Embodiments of the invention output a 'project risk today' that consists of the output of a series of machine learning models that look at patterns of issue management, checklist management, and subcontractor risk level. It is a short-term score that looks at the project risk daily. In addition, a simple workflow allows the users to change the predictions and provide feedback on predictions that they disagree with. Further, embodiments of the invention provide/output an "overall project score" that evaluates these contributing factors over a longer duration.

Additional Information

Embodiments of the invention can be used by project executives to get a high level view of projects. Projects can be grouped by risk level. Further, daily and cumulative scores and a leader board of all the projects may be shown.

FIG. 10 illustrates an exemplary output consisting of an overview of all projects for an account. As illustrated, the output indicates there are 14 active projects with a bar (e.g., color coded bar) reflecting the relative number of projects that are high risk today, medium risk, low risk, and of unknown risk.

FIG. 11 illustrates an exemplary output consisting of projects sorted by project risk level in accordance with one or more embodiments of the invention. As illustrated, a user can select whether to view the risks to "today" or "overall". The list of projects is sorted based on risk level (e.g., high, medium, or low) so that a supervisor/project executive can easily ascertain at a glance the projects that may need particular and immediate attention that day.

Visualization of Project Risk on a Historical Basis

Figure 12:
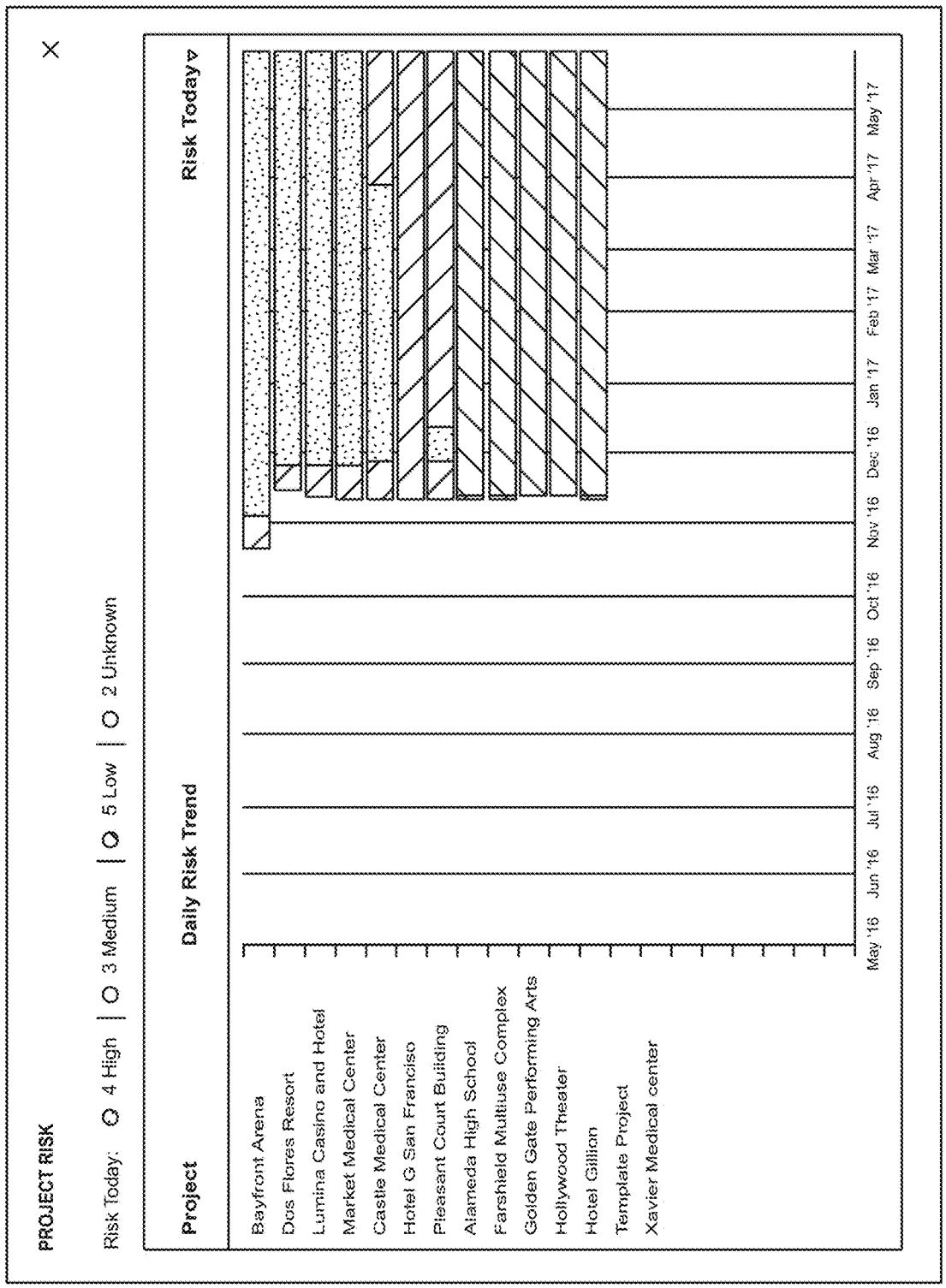
FIG. 12 illustrates an exemplary visualization of a historical project risk score heatmap in accordance with one or more embodiments of the invention.

FIG. 12 illustrates an exemplary visualization of a historical project risk score heatmap. As illustrated, the various projects are listed (vertical axis) followed by a heatmap for each project over time (horizontal axis) that reflects the risk during the respective time period.

An alternative variation of the heatmap visualization provides a view of how the risk level has varied across a project and how these trends differ between projects. Such a view allows executives to immediately grasp how the project is currently faring against how the project was previously proceeding. This is again a novel way of visualizing risk within a project and between projects.

Components of Project Risk Scores

Project risk scores are developed to reflect the state of a quality of the project at particular point in time. The feature sets used in the subcontractor level daily scores are rolled up for the corresponding project. Descriptive statistics of the shape of their distributions are also utilized (mean, mode, median, standard dev, kurtosis, skewness) as well as quantiles of these distributions across projects.

Examples of features utilized in these scores are listed below:

1. The number of subcontractors that are currently marked as high risk;
2. The volume of issues created differentiated by severity and risk category within different time horizons (e.g. yesterday, 7-day, 15-day);
3. Checklist conformance (percentage of negative items to all items) across the project; and
4. Recent Building Information System (BIM) product (e.g., BIM 360™) field activity.

Scoring Functions for All Scores

There are specific functions that contains the logic to determine how the different features are weighed and then finally combined to implement the above descried scores and risk levels. Repeated observation of the distributions of each feature set provides insight into how the functions can be improved. A few ways in which the functions can be updated include the re-calibration and re-weighting of the components and modification to the stratified binning strategies employed. These functions are continuously optimized based on feedback from the models in production so that the overall prediction error can be further reduced. Monotonic scoring functions are used to additively combine different risk metrics into a global risk index representing overall project risk. A similar approach is used at the subcontractor level of aggregation giving a view of each subcontractor's risk behavior within each project. These are further combined across projects for the same subcontractor using a form of present-biased weighting function based on project type, project size, project duration, contract value which are used as calibrators against risk metrics allowing for the generation of cross-project subcontractor quality risk indexes.

Logical Flow for Controlling AEC Project Workflow

Figure 13:
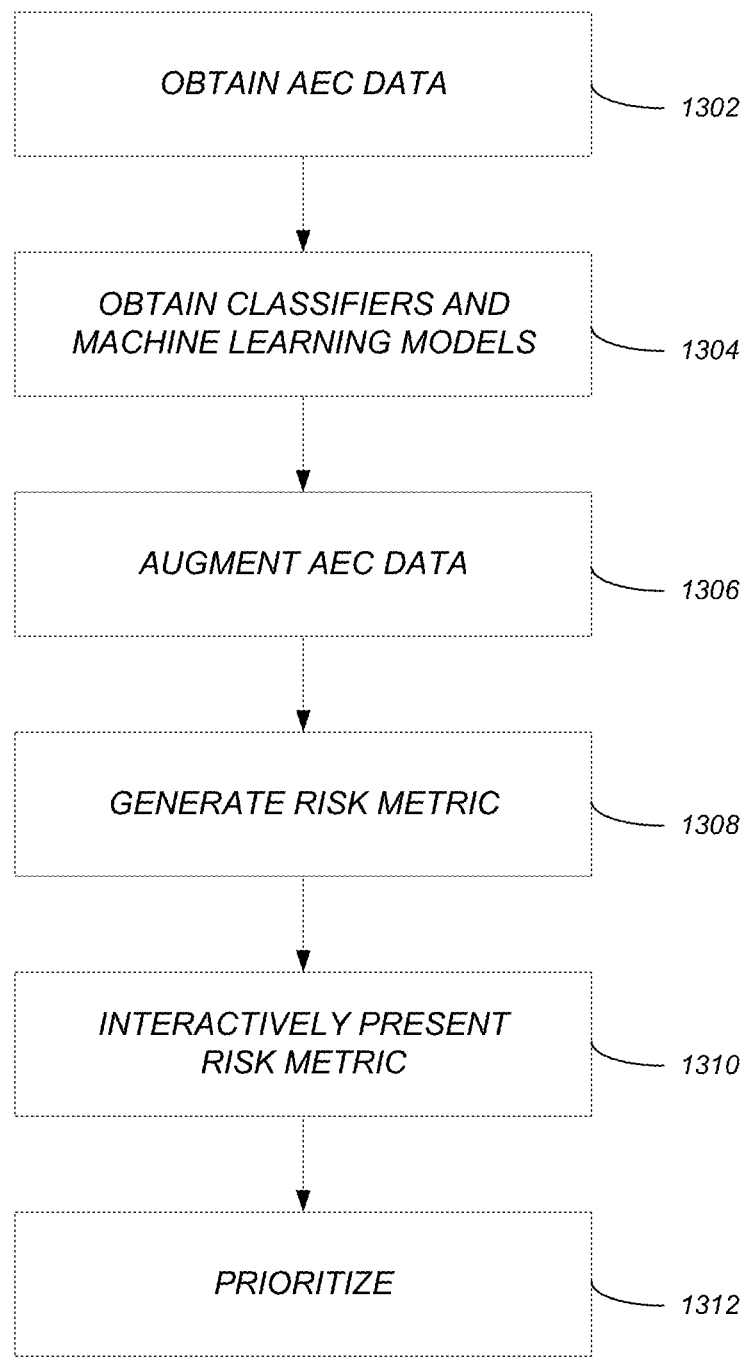
FIG. 13 illustrates the logical flow for controlling an AEC project workflow in accordance with one or more embodiments of the invention.

In view of the above described implementations and variations, FIG. 13 illustrates the logical flow for controlling an AEC project workflow in accordance with one or more embodiments of the invention.

At step 1302, AEC data regarding a quality of construction (for a construction project) is obtained. The AEC data may consist of BIM models, contracts, construction quality data, construction safety data, construction project management data, construction images (e.g., utilized as input for management of the construction project), and construction text (e.g., utilize as input for management of the construction project). The AEC data may also include structured transactions (e.g., structured numerical transaction data representative of transactions in the construction project), semi-structured text, images, and models, designs, or documents. The AEC data may further include slicers for project type and issue type that are representative of distributions of time-bound transactions in the construction project. Step 1302 may also include converting and normalizing the AEC data. In addition, step 1302 may assess a quality of the AEC data based on cleanliness (e.g., of the construction project), construction context fitness, and standards conformance.

At step 1304, a set of classifiers and machine learning models are built/obtained (e.g., using construction quality data recorded daily by a construction team on a construction job site, wherein the set of classifiers and machine learning modules identify historical contributing factors that impact completion of the construction project).

At step 1306, the AEC data is augmented based on the set of classifiers and machine learning models. Such augmentation may be based on a text categorization, image classifiers, context awareness, and labelling. The augmentation may further be based on transactional identifiers (representative of a category of risk) relating to transactions occurring during construction. Alternatively, or in addition, the augmentation may be based on transaction risk classifiers that classify a level of risk for each of the transactions.

At step 1308, a risk metric is generated for one or more issues in the AEC data based on the augmented AEC data. The risk metric may predict a subcontractor rating at an issue level that is used to distinguish subcontractors. For example, a subcontractor risk score based on a frequency of issues, recency of issues, and benchmarks for subcontractors may be generated. Further, the risk metric may predict a project risk level based on quality, safety, schedule, and cost (e.g., frequency of issues, recency of issues, and benchmarks for projects).

At step 1310, the risk metric is interactively generated and presented on a display device. Such a visualization may consist of a heatmap of subcontractor risk levels over time. Such a heatmap may be used to compare and hire subcontractors for the construction project. In addition, the visualization may include an interface showing all projects ranked by risk level on a daily duration or an overall time duration. In one or more embodiments, the visualization of the risk metrics provides the ability to modify the risk metrics based on user input in the visualization. Thereafter, the machine learning model may be updated based on the modification and a feedback loop is provided that predicts the risk metrics (for subcontractors and/or projects) and may be utilized to distinguish subcontractors (e.g., for hiring determinations).

At step 1312, work, project resourcing, and/or training are prioritized based on the risk metric. Such prioritization may include actually physically constructing the construction project in the real world based on the prioritization.

LUSI: Labelling Large Datasets Using Human Scale Input

Overview

The most typical and dire issues with utilization data for supervised machine learning is the lack of labels (e.g. performance variable/target values) for many of the data instances. Most data science teams feel they invest a majority of their time collecting labels or validating labels. Together these tasks account for about 50 to 70% of the project time. Embodiments of the invention include infrastructure and integrated components that support a methodology that is based on semi-supervised classifiers utilizing input generated by subject-matter experts.

Basic Components

LUSI is designed to solve the above-described problem. It enables users to label large data sets automatically by only providing a very small human scale input. The LUSI methodology is effectively comprised of three main parts:

1. Intelligent ways to extract representative samples of data using unsupervised methods weighted by weight-of-evidence and value-metrics based on the target variable;
2. Provision of samples to SMEs (Subject Matter Experts) who in turn provide labels that are then inserted back into the system; and
3. Label propagation schemes based on different metrics of 'similarity' between the labeled samples and clusters generated by the methods in part 1.

Figure 14:
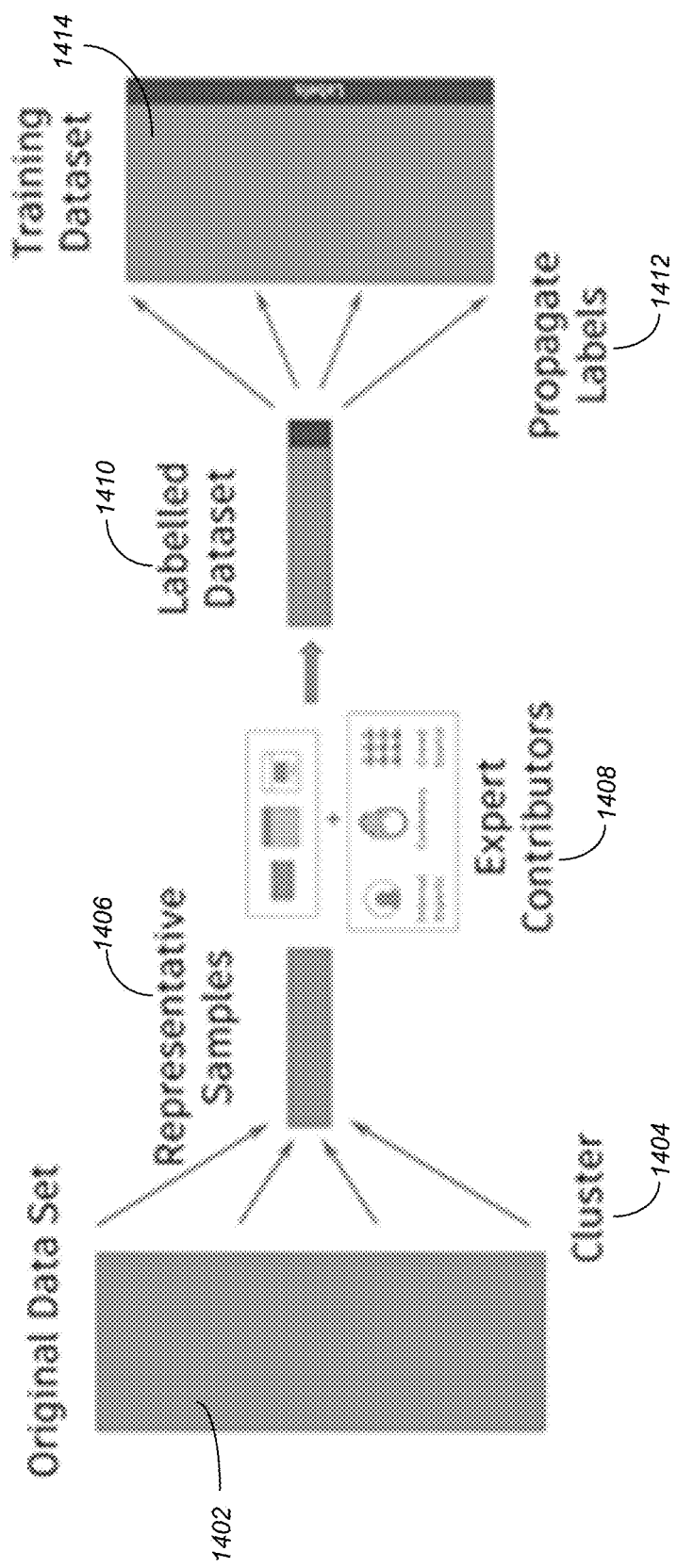
FIG. 14 illustrates the LUSI Methodology Basic Components utilized in accordance with one or more embodiments of the invention.

FIG. 14 illustrates the LUSI Methodology Basic Components utilized in accordance with one or more embodiments of the invention. From the original data set 1402, LUSI identifies the 1% to 5% of the data points that represents the bulk of data set (i.e., LUSI clusters 1404 data from the original data set 1402 to identify representative samples 1406). Subject matter experts 1408 label this smaller data set 1402 (resulting in labelled dataset 1410). Such a process provides a 10× to 100× reduction in the human work required. Further, this process speeds up the labelling process from months to weeks.

After these representative data points 1406 are labelled (i.e., producing labelled dataset 1410), LUSI propagates 1412 the labels to the original larger data set 1402, based on a distance metric. This results in a data set 1414 that's at least 10× larger than the labelled data points 1410. The resulting training dataset 1414 contains enough data volume to train a modern machine learning method/algorithm.

Details about the Methodology

LUSI is both a methodology and an embodiment (system) that motivates the generation and propagation of labels (that is subject matter expert classifications) of different data (of different data types). The system provides for a way for labeling and providing details about the basis of the labeling to subject matter experts 1408; these are the humans in the loop. The data types supported are tabular data, text data, documents, 3D models, images/photos.

Figure 15:
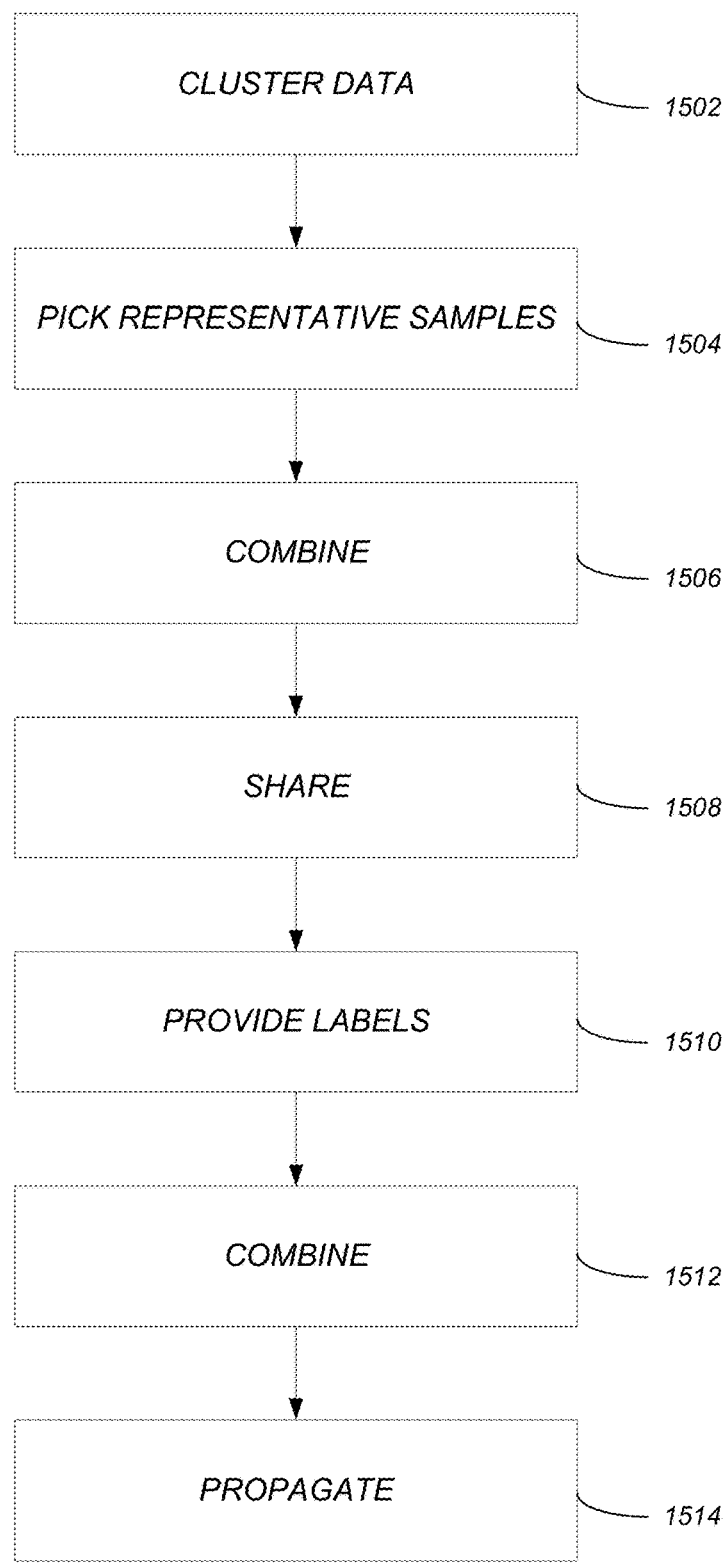
FIG. 15 illustrates the logical flow for labelling datasets using human scale input in accordance with one or more embodiments of the invention.

FIG. 15 illustrates the logical flow for labelling datasets using human scale input in accordance with one or more embodiments of the invention. The steps of FIG. 15 are described with reference to the components of FIG. 14.

The original data set 1402 may include one hundred thousand data points including text documents. The goals is to bucket the data points into three classes sufficient for training models.

At step 1502, the original data set 1402 is clustered using unsupervised methods that evaluates cluster quality (e.g., using metrics such as average distance to the center, cluster size, and other density metrics) and divides the clusters based on density (e.g., extremely dense, moderately dense, and not very dense [based on various threshold levels for each category]). Accordingly, the clustering 1502 clusters the data into about 1000 clusters.

Representative samples 1406 are then selected/picked from the clusters at step 1504. For example, one sample (of N size) may be selected from the extremely dense cluster, a few may be selected from the moderately dense cluster, and a predefined number of samples (e.g., 10) may be selected from the not very dense cluster.

At step 1506, the representative samples are combined into a master data set that is representative of the large original data set 1402. The degree of representation may be calculated. This step may include getting/converting the data into a shareable format. Low-tech solutions may include pasting the data into an email. Alternatively, the data may be placed into an spreadsheet or may utilize crowdsourcing solutions (e.g., CROWDFLOWER™)

At step 1508, the samples are shared with subject matter experts 1408. Such experts may be qualified labelers such as internal experts (e.g., folks who have worked in the industry or PhDs). The subject matter experts may also be customers that label their own data. Alternatively, a network of qualified TURKERS™ may be utilized (e.g., selected by clearing qualifying tasks).

At step 1510, the subject matter experts provide labels for the different samples. Embodiments may also include overlap between subject matter experts to assess Inter Rater Reliability scores to assess quality and calibrate.

At step 1512, the master data set 1406 is combined with the labels to produce the labelled dataset 1410. In this regard, step 1512 may include combining and cleaning the labelled data.

At step 1514, the labels (e.g., via the labeled dataset 1410) are propagated out to the original larger data set 1402 (where the samples 1406 were extracted from). the propagation may use different variants of nearest neighbor techniques and assignment of the label based on the closeness of the unlabeled data tuple to the ones in the labelled dataset 1410. This can be achieved through a closest neighbor methodology, through the use of a voting scheme looking at the closest N neighbors either equality or weighted by the closeness. For example, for each data point, the nearest neighbors are identified, and the label is propagated to the nearest/closest one, within a threshold. This propagation works on a variety of data including numerical, text, image, 3D model, and/or data from a design graph.

Image/Text Recognition Workflow

Embodiments of the invention are not constrained into utilizing classifiers in batch mode (that is in the backend on data ex post facto). Instead, additional embodiments of the invention allow for the utilization of image classification/object detection as well as text mining to generate construction-specific workflows and data quality indices, based on what is detected by images and what is captured by text (either typed or voice-to-text).

Inputs

Inputs to an image/text recognition workflow may include one or more of the following:

1. Image captured by app/phone/tablet;
2. Text captured by typing into app/phone/tablet;
3. Text captured by voice (converted to text) into app/phone/tablet;
4. Location captured by GPS and other IOT (Internet of Things) devices on the construction job site;
5. Historical risk profile of the subcontractor and the project; and
6. Any combination of the above.

Risk Factor Extraction

To extract the risk factors, one or more of the following components/steps may be utilized/performed:

1. Image processing system for detecting construction equipment, material, hazards, risks, defects and object orientation are run;
2. Features are extracted from images and pushed to policy arbiters;
3. Text processing system for detecting hazards, risks, tones, defects are run. May also be combined with quality severity, issue classifiers, and other classifiers that provide context awareness; and
4. Features are extracted from text and pushed to policy arbiters.
   a. These may be extracted against Topic Models (e.g. construction-specific word2vec);
   b. These may include triggers based on information provided by users.

Policy Arbiters

Policy arbiters are rule-based or model-based logic that triggers a workflow using activation functions (i.e. OR, XOR, AND). Arbiters expect (as inputs) the risk factors identified through the images/text and from the specifics of the context of the capture of the text/images (e.g. project, who is capturing, where, when, etc.).

If policy violations are captured then workflows may be triggered to report and address violations. Similarly, if quality defects (and their respective severity based on defined thresholds) are detected, then assistive workflows may be triggered for propagation and assignment of these issues to other entities.

Workflows

Figure 16:
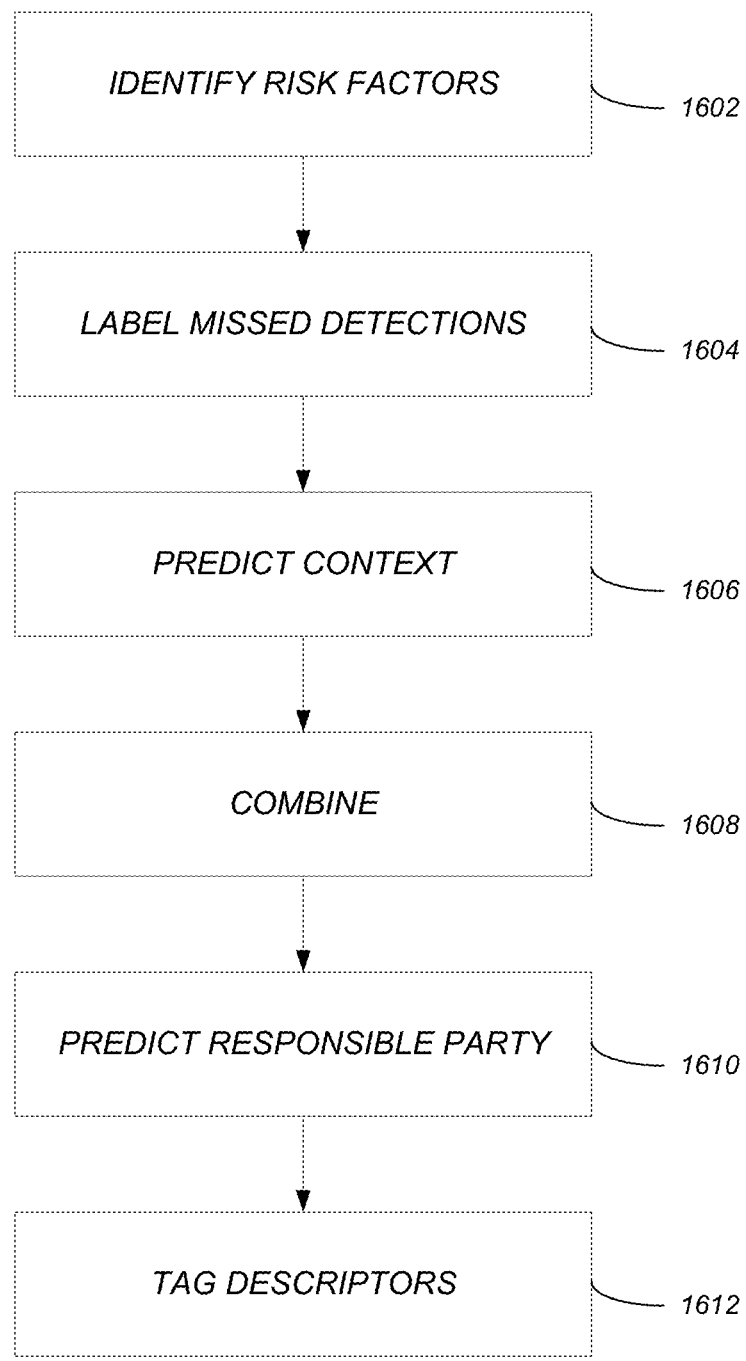
FIG. 16 illustrates the logical workflow for automated data capture in accordance with one or more embodiments of the invention.

Workflows represent a set of steps for addressing risks, hazards, and defects in construction, and automating the data capture process to improve data quality index and project performance. FIG. 16 illustrates the logical workflow for automated data capture in accordance with one or more embodiments of the invention.

At step 1602, the risk factors are identified from the text and images.

At step 1604, a human may be used in a loop that data tags to label missed detections.

At step 1606, policy arbiters are used to predict the context of the defect or risk.

At step 1608, the information determined in steps 1602-1606 is combined with prior data collected on the project generated text to describe the context using feed forward neural networks.

At step 1610, the responsible party is predicted.

At step 1612, other descriptors (e.g., risk, hazard, defects) are identified/tagged.

Figure 17:
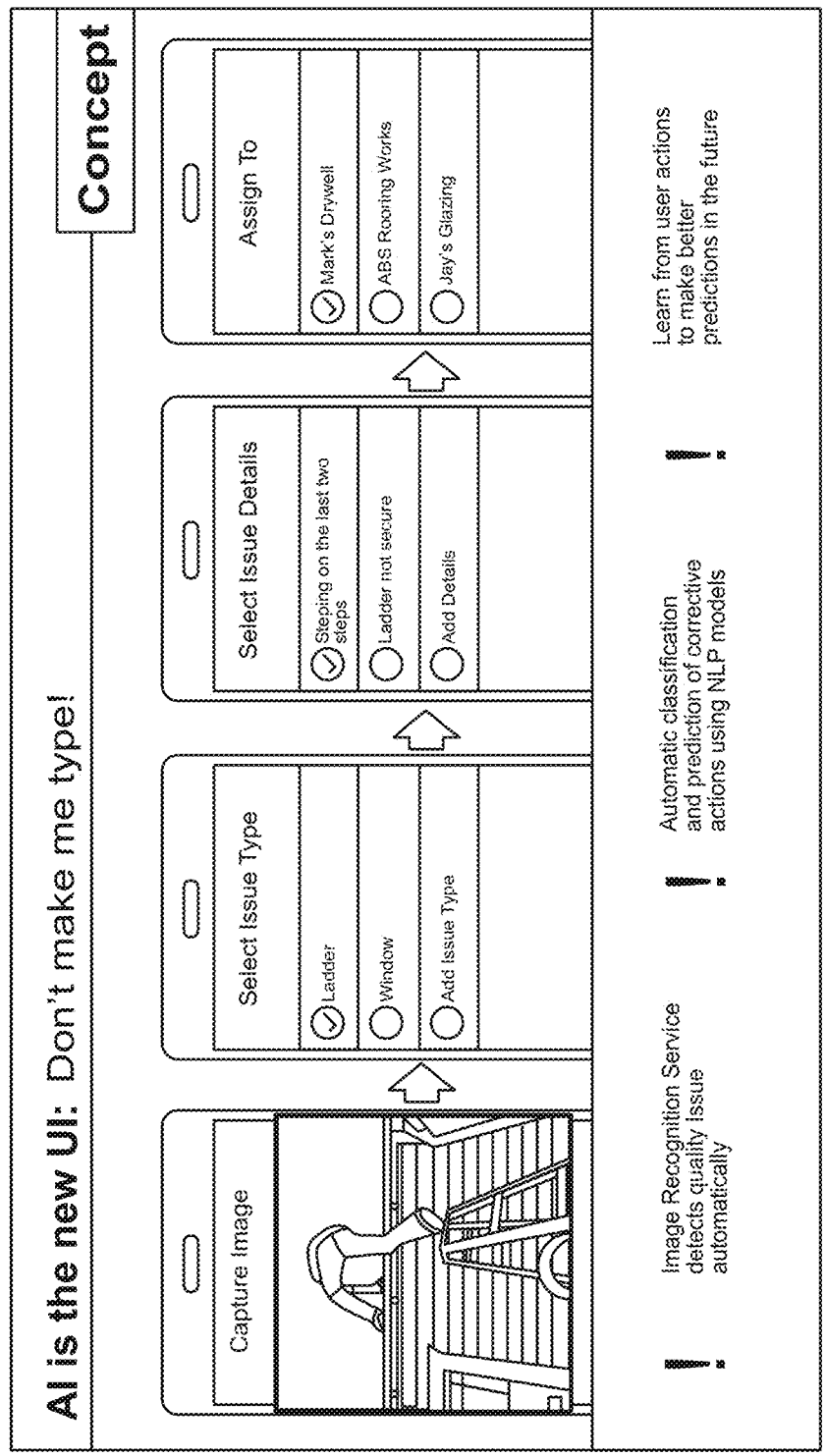
FIG. 17 illustrates an exemplary data capture workflow that incorporates artificial intelligence in accordance with one or more embodiments of the invention.

An example for workflow for data capture is represented in FIG. 17. In this regard, FIG. 17 illustrates an exemplary data capture workflow that incorporates artificial intelligence in accordance with one or more embodiments of the invention. As illustrated, an image recognition service detects a quality issue automatically, automatically classifies and predicts corrective actions (e.g., using NLP [neurolinguistic programming] models), and learns from user actions to make better predictions in the future. A user captures the image, selects an issue type, selects issue details, and assigns the issue to a particular subcontractor.

Figure 18A:
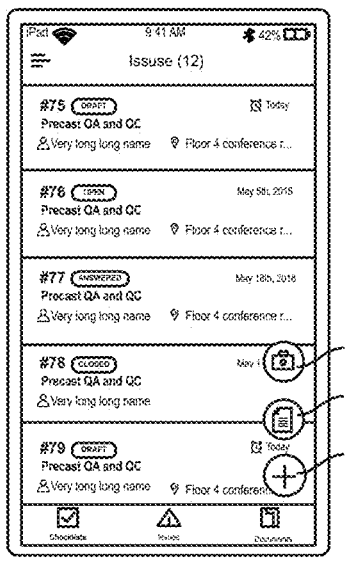
FIGS. 18A-E illustrates the step-by-step representation of the actual presentation utilizing an exemplary workflow structure in accordance with one or more embodiments of the invention.

A decomposition of the steps in the data capture workflow is illustrated in FIGS. 18A-E. In this regard, FIGS. 18A-E illustrates the step-by-step representation of the actual presentation utilizing an exemplary workflow structure in accordance with one or more embodiments of the invention. In FIG. 18A, the user has elected to start the image capture process. (e.g., by selecting one of the icons 1802 depending on the type of data to be captured).

Figure 18B:
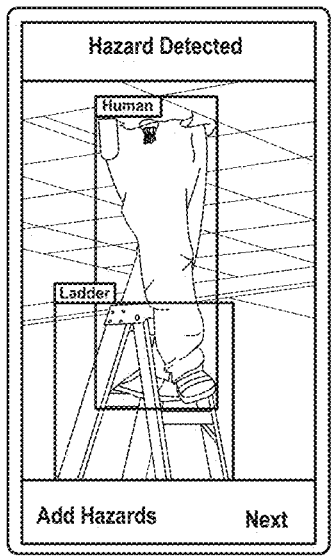
Figure 18C:
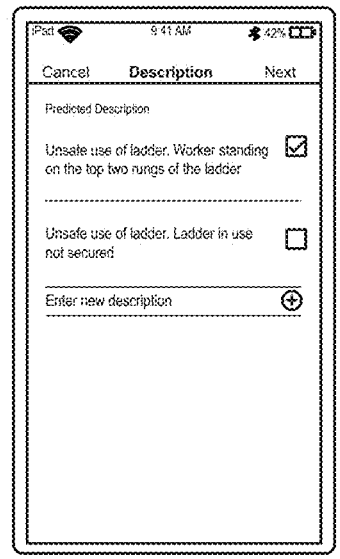

In this example illustrated, the user selected the icon of the camera to initiate the capture of a photograph. FIG. 18B illustrates an automatic detection of a hazard that has been tagged in the captured image. FIG. 18C illustrates an automatic suggestion of the issue description (e.g., "Insafe use of ladder. Worker standing on the top two rungs of the ladder." and/or "Unsafe use of ladder. Ladder in use not secured."). The user has the option of selection suggested text or enter a new description of the issue.

Figure 18D:
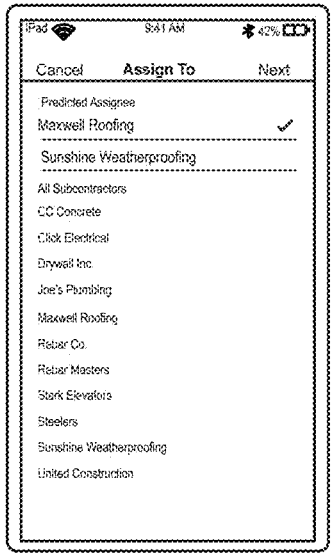
Figure 18E:
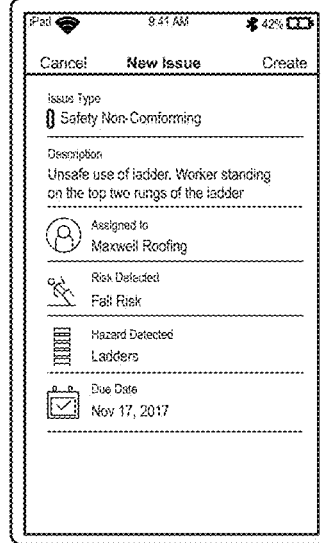

In FIG. 18D, embodiments of the invention provide an automatic suggestion for who the issue should be assigned to. In FIG. 18E, the a new safety issue is captured and provides an identification of the data and selections made in FIGS. 18A-D.

Thus, the workflow described above allows for the ease of capture of quality/safety issues on the fly, provides recommendations, and ultimately allow users to provide direct feedback at the point of capture hence strongly reducing errors and significantly improving the quality of the data captured.

Human in the Loop Data Tagging

As described above, embodiments of the invention provides built in mechanisms for the human agent to correct or add risk, hazard, and/or defect tags to the text and image. The human can draw bounding boxes around areas of interest in the images to add the tags and tap on words or phrases to mark them.

Workflows for Addressing Risk

In view of the above, the workflows for addressing risk effectively requires one or more of the following steps:
1. Identify that there are risks, hazards, defects;
2. Assess context;
3. Assess severity;
4. Match context and issues as inputs to policies; and
5. If policy preconditions are active, then trigger their workflow.

Figure 19:
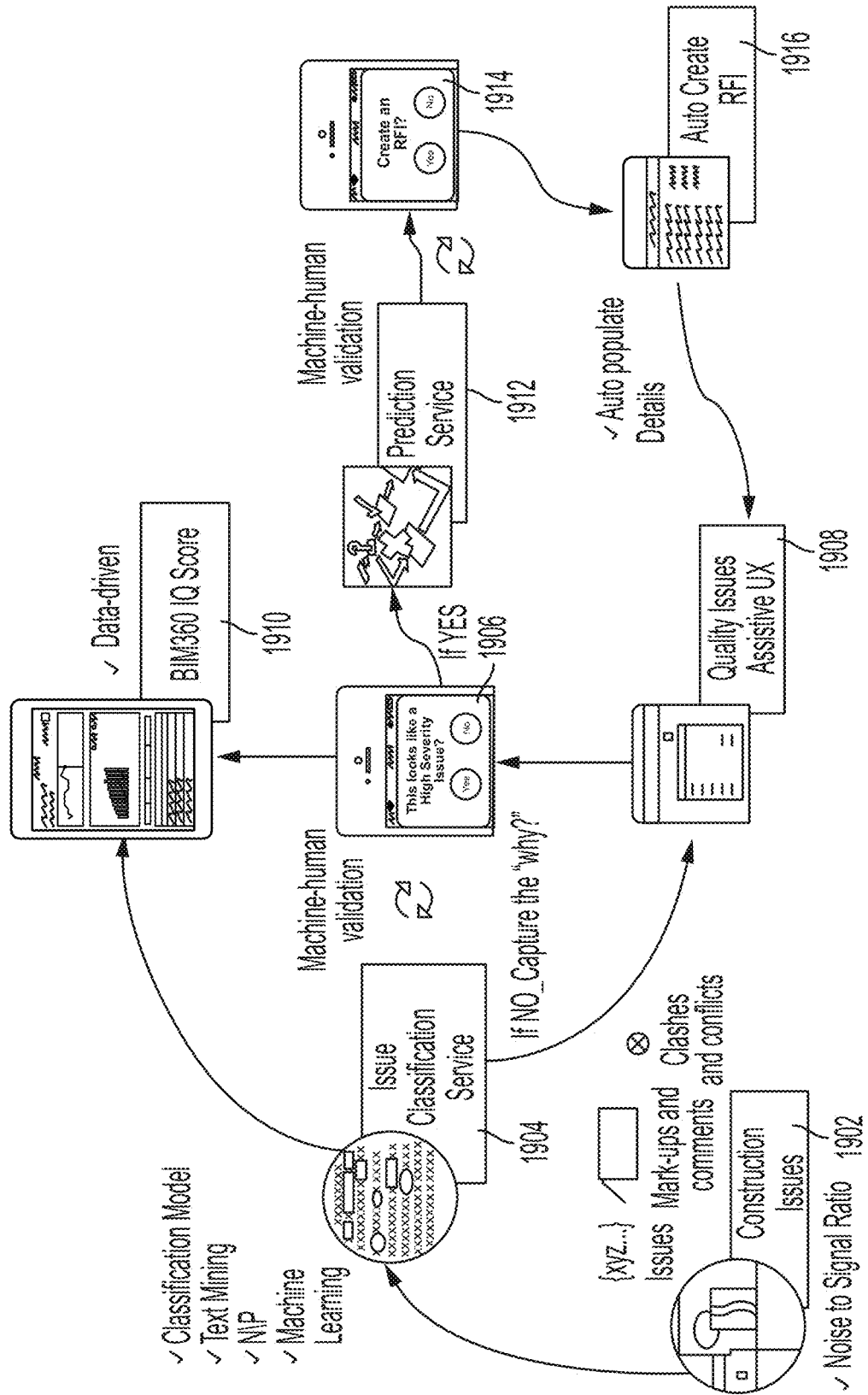
FIG. 19 illustrates an exemplary workflow for triggering RFIs from image/text-based risk classifiers in accordance with one or more embodiments of the invention.

FIG. 19 illustrates an exemplary workflow for triggering RFIs from image/text based risk classifiers in accordance with one or more embodiments of the invention. As illustrated, construction issues 1902 are first identified. An issue classification service 1904 then classifies the issue based on classification models, text mining, NLP, and machine learning. Via a device 1906 (e.g., computer, cellular device, touch-based device, hand-held device, etc.), the classification can be modified/validated. Further, the validation/adjustment of the issue may be performed in a loop accompanied by quality issues in an assistive user experience design (UX) 1908. Once the classification/identification is complete, a data driven score 1910 for the risk/issue may be generated. Further, a prediction service 1912 may be used to perform additional validation and provide an option to create an RFI (request for information) 1914. At 1916, an RFI is automatically created (e.g., details are auto-populated) and provided to the assistive UX 1908 for further processing.

Data Quality Index

Data from the factor extraction pipeline may also fed into the data quality index as features. There features are fused together using a machine learning model to quantify the quality of the risk factors detected in the data captured as images and text on a construction project. This is blended with historical project and subcontractor data using weights to estimate the data quality index for that project and measure best practice adoption by the subcontracts on the project.

Hardware Environment

Figure 20:
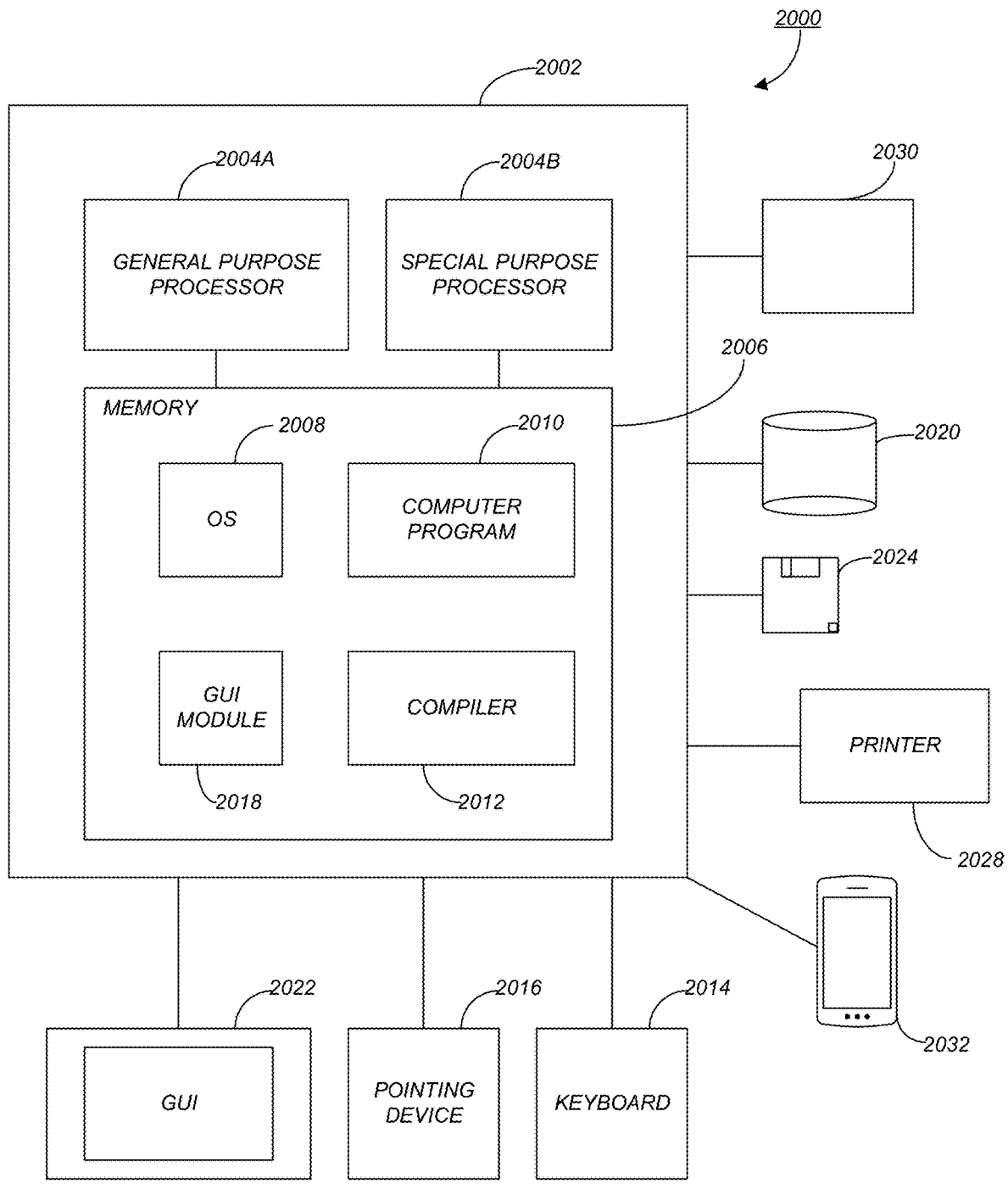
FIG. 20 is an exemplary hardware and software environment used to implement one or more embodiments of the invention.

FIG. 20 is an exemplary hardware and software environment 2000 used to implement one or more embodiments of the invention. The hardware and software environment include a computer 2002 and may include peripherals. Computer 2002 may be a user/client computer, server computer, or may be a database computer. The computer 2002 comprises a general-purpose hardware processor 2004A and/or a special purpose hardware processor 2004B (hereinafter alternatively collectively referred to as processor 2004) and a memory 2006, such as random access memory (RAM). The computer 2002 may be coupled to, and/or integrated with, other devices, including input/output (I/O) devices such as a keyboard 2014, a cursor control device 2016 (e.g., a mouse, a pointing device, pen and tablet, touch screen, multi-touch device, etc.) and a printer 2028. In one or more embodiments, computer 2002 may be coupled to, or may comprise, a portable or media viewing/listening device 2032 (e.g., an MP3 player, IPOD, NOOK, portable digital video player, cellular device, personal digital assistant, etc.). In yet another embodiment, the computer 2002 may comprise a multi-touch device, mobile phone, gaming system, internet enabled television, television set top box, or other internet enabled device executing on various platforms and operating systems.

In one embodiment, the computer 2002 operates by the general-purpose processor 2004A performing instructions defined by the computer program 2010 under control of an operating system 2008. The computer program 2010 and/or the operating system 2008 may be stored in the memory 2006 and may interface with the user and/or other devices to accept input and commands and, based on such input and commands and the instructions defined by the computer program 2010 and operating system 2008, to provide output and results.

Output/results may be presented on the display 2022 or provided to another device for presentation or further processing or action. In one embodiment, the display 2022 comprises a liquid crystal display (LCD) having a plurality of separately addressable liquid crystals. Alternatively, the display 2022 may comprise a light emitting diode (LED) display having clusters of red, green and blue diodes driven together to form full-color pixels. Each liquid crystal or pixel of the display 2022 changes to an opaque or translucent state to form a part of the image on the display in response to the data or information generated by the processor 2004 from the application of the instructions of the computer program 2010 and/or operating system 2008 to the input and commands. The image may be provided through a graphical user interface (GUI) module 2018. Although the GUI module 2018 is depicted as a separate module, the instructions performing the GUI functions can be resident or distributed in the operating system 2008, the computer program 2010, or implemented with special purpose memory and processors.

In one or more embodiments, the display 2022 is integrated with/into the computer 2002 and comprises a multi-touch device having a touch sensing surface (e.g., track pod or touch screen) with the ability to recognize the presence of two or more points of contact with the surface. Examples of multi-touch devices include mobile devices (e.g., IPHONE, NEXUS S, DROID devices, etc.), tablet computers (e.g., IPAD, HP TOUCHPAD), portable/handheld game/music/ video player/console devices (e.g., IPOD TOUCH, MP3 players, NINTENDO 3DS, PLAYSTATION PORTABLE, etc.), touch tables, and walls (e.g., where an image is projected through acrylic and/or glass, and the image is then backlit with LEDs).

Some or all of the operations performed by the computer 2002 according to the computer program 2010 instructions may be implemented in a special purpose processor 2004B. In this embodiment, some or all of the computer program 2010 instructions may be implemented via firmware instructions stored in a read only memory (ROM), a programmable read only memory (PROM) or flash memory within the special purpose processor 2004B or in memory 2006. The special purpose processor 2004B may also be hardwired through circuit design to perform some or all of the operations to implement the present invention. Further, the special purpose processor 2004B may be a hybrid processor, which includes dedicated circuitry for performing a subset of functions, and other circuits for performing more general functions such as responding to computer program 2010 instructions. In one embodiment, the special purpose processor 2004B is an application specific integrated circuit (ASIC).

The computer 2002 may also implement a compiler 2012 that allows an application or computer program 2010 written in a programming language such as C, C++, Assembly, SQL, PYTHON, PROLOG, MATLAB, RUBY, RAILS, HASKELL, or other language to be translated into processor 2004 readable code. Alternatively, the compiler 2012 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 2010 accesses and manipulates data accepted from I/O devices and stored in the memory 2006 of the computer 2002 using the relationships and logic that were generated using the compiler 2012.

The computer 2002 also optionally comprises an external communication device such as a modem, satellite link, Ethernet card, or other device for accepting input from, and providing output to, other computers 2002.

In one embodiment, instructions implementing the operating system 2008, the computer program 2010, and the compiler 2012 are tangibly embodied in a non-transitory computer-readable medium, e.g., data storage device 2020, which could include one or more fixed or removable data storage devices, such as a zip drive, floppy disc drive 2024, hard drive, CD-ROM drive, tape drive, etc. Further, the operating system 2008 and the computer program 2010 are comprised of computer program 2010 instructions which, when accessed, read and executed by the computer 2002, cause the computer 2002 to perform the steps necessary to implement and/or use the present invention or to load the program of instructions into a memory 2006, thus creating a special purpose data structure causing the computer 2002 to operate as a specially programmed computer executing the method steps described herein. Computer program 2010 and/or operating instructions may also be tangibly embodied in memory 2006 and/or data communications devices 2030, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 2002.

Figure 21:
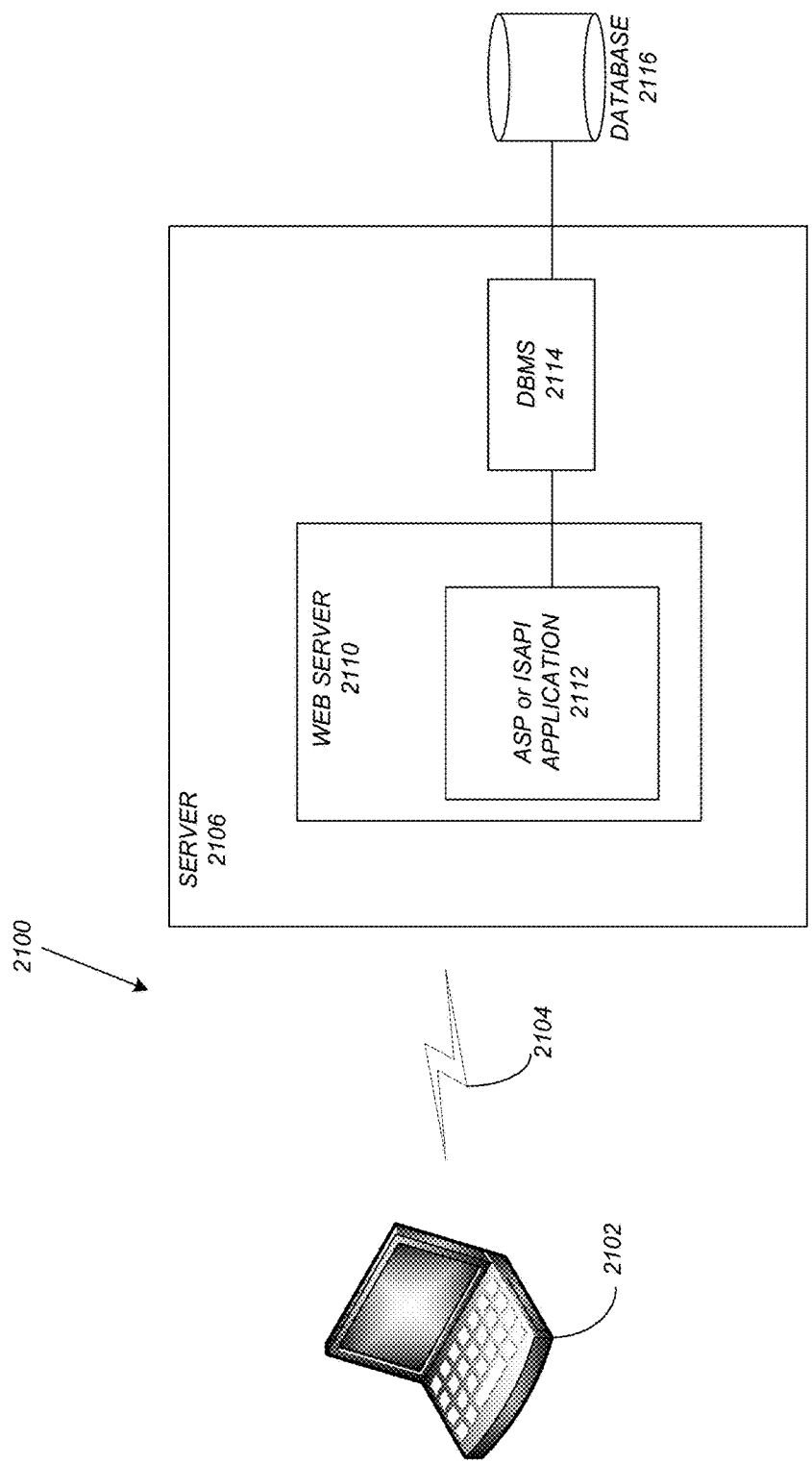
FIG. 21 schematically illustrates a typical distributed/cloud-based computer system using a network to connect client computers to server computers in accordance with one or more embodiments of the invention.

FIG. 21 schematically illustrates a typical distributed/cloud-based computer system 2100 using a network 2104 to connect client computers 2102 to server computers 2106. A typical combination of resources may include a network 2104 comprising the Internet, LANs (local area networks), WANs (wide area networks), SNA (systems network architecture) networks, or the like, clients 2102 that are personal computers or workstations (as set forth in FIG. 20), and servers 2106 that are personal computers, workstations, minicomputers, or mainframes (as set forth in FIG. 20). However, it may be noted that different networks such as a cellular network (e.g., GSM [global system for mobile communications] or otherwise), a satellite based network, or any other type of network may be used to connect clients 2102 and servers 2106 in accordance with embodiments of the invention.

A network 2104 such as the Internet connects clients 2102 to server computers 2106. Network 2104 may utilize ethernet, coaxial cable, wireless communications, radio frequency (RF), etc. to connect and provide the communication between clients 2102 and servers 2106. Further, in a cloud-based computing system, resources (e.g., storage, processors, applications, memory, infrastructure, etc.) in clients 2102 and server computers 2106 may be shared by clients 2102, server computers 2106, and users across one or more networks. Resources may be shared by multiple users and can be dynamically reallocated per demand. In this regard, cloud computing may be referred to as a model for enabling access to a shared pool of configurable computing resources.

Clients 2102 may execute a client application or web browser and communicate with server computers 2106 executing web servers 2110. Such a web browser is typically a program such as MICROSOFT INTERNET EXPLORER, MOZILLA FIREFOX, OPERA, APPLE SAFARI, GOOGLE CHROME, etc. Further, the software executing on clients 2102 may be downloaded from server computer 2106 to client computers 2102 and installed as a plug-in or ACTIVEX control of a web browser. Accordingly, clients 2102 may utilize ACTIVEX components/component object model (COM) or distributed COM (DCOM) components to provide a user interface on a display of client 2102. The web server 2110 is typically a program such as MICROSOFT'S INTERNET INFORMATION SERVER.

Web server 2110 may host an Active Server Page (ASP) or Internet Server Application Programming Interface (ISAPI) application 2112, which may be executing scripts. The scripts invoke objects that execute business logic (referred to as business objects). The business objects then manipulate data in database 2116 through a database management system (DBMS) 2114. Alternatively, database 2116 may be part of, or connected directly to, client 2102 instead of communicating/obtaining the information from database 2116 across network 2104. When a developer encapsulates the business functionality into objects, the system may be referred to as a component object model (COM) system. Accordingly, the scripts executing on web server 2110 (and/or application 2112) invoke COM objects that implement the business logic. Further, server 2106 may utilize MICROSOFT'S TRANSACTION SERVER (MTS) to access required data stored in database 2116 via an interface such as ADO (Active Data Objects), OLE DB (Object Linking and Embedding DataBase), or ODBC (Open Data-Base Connectivity).

Generally, these components 2100-2116 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 2102 and 2106 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 2102 and 2106. Accordingly, embodiments of the invention are implemented as a software application on a client 2102 or server computer 2106. Further, as described above, the client 2102 or server computer 2106 may comprise a thin client device or a portable device that has a multi-touch-based display.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for controlling an architecture, engineering, and construction (AEC) project workflow, comprising:
   (a) obtaining AEC data regarding a quality of construction for a construction project, wherein the AEC data comprises building information (BIM) models, contracts, construction quality data, construction safety data, construction project management data, construction images, and construction text;
   (b) building a set of classifiers and machine learning models using the construction quality data recorded daily by a construction team on a construction jobsite, wherein the set of classifiers and machine learning models identify historical contributing factors that impact completion of the construction project;
   (c) augmenting the AEC data based on the set of classifiers and machine learning models;
   (d) generating a risk metric for one or more issues in the AEC data based on the augmented AEC data, wherein the risk metric:
      (1) predicts a subcontractor rating at an issue level that is used to distinguish subcontractors; and
      (2) predicts a project risk level based on quality, safety, schedule, and cost;
   (e) interactively presenting a visualization of the risk metric on a display device, wherein the visualization comprises:
      (1) a heatmap of subcontractor risk levels over time, wherein the heatmap is used to further compare and hire subcontractors for the construction project; and
      (2) an interface showing all projects ranked by risk level on a daily duration or an overall time duration; and
      wherein the interactively presenting comprises:
         generating the visualization of the risk metric;
         modifying the risk metric based on user input in the visualization; and
         updating one or more of the machine learning models based on the modification, wherein the machine learning models provide a feedback loop that predicts the risk metric; and
   (f) via the visualization, prioritizing work, project resourcing, and/or training based on the risk metric.

2. The computer-implemented method of claim 1, wherein the AEC data further comprises:
   structured numerical transaction data representative of transactions in the construction project;
   slicers for project type and issue type that are representative of distributions of time-bound transactions in the construction project;
   the construction text utilized as input for management of the construction project; and
   the construction images utilized as input for management of the construction project.

3. A computer-implemented method for controlling an architecture, engineering, and construction (AEC) project workflow, comprising:
   obtaining AEC data regarding a quality of construction;
   obtaining a set of classifiers and machine learning models;
   augmenting the AEC data based on the set of classifiers and machine learning models;
   generating a risk metric for one or more issues in the AEC data based on the augmented AEC data;
   interactively presenting the risk metric on a display device wherein the interactively presenting comprises:
      generating a visualization of the risk metric;
      modifying the risk metric based on user input in the visualization; and
      updating one or more of the machine learning models based on the modification, wherein the machine learning models provide a feedback loop that predicts the risk metric; and
   prioritizing work, project resourcing, and/or training based on the risk metric.

4. The computer-implemented method of claim 3, wherein the AEC data comprises:
   structured transactions;
   semi-structured text;
   images; and
   models, designs, or documents.

5. The computer-implemented method of claim 3, further comprising:
converting and normalizing the AEC data.

6. The computer-implemented method of claim 3, further comprising:
assessing a quality of the AEC data based on cleanliness of a construction project, construction context fitness, and standards conformance.

7. The computer-implemented method of claim 3, wherein the augmenting comprises:
augmenting the AEC data based on a text categorization, image classifiers, context awareness, and labelling.

8. The computer-implemented method of claim 3, wherein the augmenting further comprises:
augmenting the AEC data based on transactional identifiers relating to one or more transactions occurring during construction, wherein the transactional identifiers relate to a category of risk.

9. The computer-implemented method of claim 3, wherein the augmenting further comprises:
augmenting the AEC data based on transaction risk classifiers that classify a level of risk of each of one or more transactions.

10. The computer-implemented method of claim 3, wherein the generating the risk metric comprises:
generating a subcontractor risk score based on a frequency of issues, recency of issues, and benchmarks for subcontractors.

11. The computer-implemented method of claim 10, wherein the updated machine learning model is utilized to distinguish subcontractors.

12. The computer-implemented method of claim 3, wherein the generating the risk metric comprises:
generating a project risk score based on a frequency of issues, recency of issues, and benchmarks for projects.

13. The computer-implemented method of claim 12, wherein the machine learning model predicts the risk metrics for other projects.

14. A system for controlling an architecture, engineering, and construction (AEC) project workflow, comprising:
(a) a computer;
(b) a data layer maintained by the computer, wherein the data layer comprises:
(1) AEC data representative of a quality of construction;
(2) a set of classifiers and machine learning models;
(c) a data augmentation layer maintained by the computer, wherein the data augmentation layer comprises:
(1) data augmentors that augment the AEC data based on the set of classifiers and machine learning models;
(d) a model scoring layer executed by the computer, wherein the model scoring layer:
(1) generates a risk metric for one or more issues in the AEC data based on the augmentation layer; and
(2) interactively presents the risk metric on a display device;
wherein the interactively presents comprises:
generating a visualization of the risk metric;
modifying the risk metric based on user input in the visualization; and
updating one or more of the machine learning models based on the modification, wherein the one or more machine learning models provide a feedback loop that predicts the risk metric; and
wherein work, project resourcing, and/or training are prioritized to conduct construction based on the risk metric.

15. The system of claim 14, wherein the AEC data comprises:
structured transactions;
semi-structured text;
images; and
models, designs, or documents.

16. The system of claim 14, wherein the data layer further comprises a data conversion and normalization component that converts and normalizes the AEC data.

17. The system of claim 14, wherein the data layer further comprises a data quality assessment score component that assesses a quality of the AEC data based on cleanliness of a construction project, construction context fitness, and standards conformance.

18. The system of claim 14, wherein the data augmentors augment the AEC data based on a text categorization, image classifiers, context awareness, and labelling.

19. The system of claim 14, wherein the data augmentation layer further comprises a transactional identifier component that augments the AEC data based on transactional identifiers relating to one or more transactions occurring during construction, wherein the transactional identifiers relate to a category of risk.

20. The system of claim 14, wherein the data augmentation layer further comprises a transactional risk classifier component that augments the AEC data based on transaction risk classifiers that classify a level of risk of each of one or more transactions.

21. The system of claim 14, wherein the model scoring layer further comprises a subcontractor risk score component that generates a subcontractor risk score based on a frequency of issues, recency of issues, and benchmarks for subcontractors.

22. The system of claim 21, wherein the updated machine learning model is utilized to distinguish subcontractors.

23. The system of claim 14, wherein the model scoring layer further comprises a project risk score component that generates a project risk score based on a frequency of issues, recency of issues, and benchmarks for projects.

24. The system of claim 23, wherein the machine learning model predicts the risk metrics for other projects.

* * * * *